United States Patent
Lee et al.

(10) Patent No.: US 10,592,056 B2
(45) Date of Patent: Mar. 17, 2020

(54) TOUCH SENSOR INCLUDING VARIOUS SENSING ELECTRODES OF DIFFERENT SIZES AND DISPLAY DEVICE INCLUDING THE TOUCH SENSOR

(71) Applicant: Samsung Display Co., Ltd., Yongin-si (KR)

(72) Inventors: Soo Jung Lee, Yongin-si (KR); Hyoung Wook Jang, Yongin-si (KR); Gwang Bum Ko, Yongin-si (KR); Jeong Yun Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/969,946

(22) Filed: May 3, 2018

(65) Prior Publication Data
US 2019/0025956 A1 Jan. 24, 2019

(30) Foreign Application Priority Data
Jul. 20, 2017 (KR) .................... 10-2017-0091991

(51) Int. Cl.
*G06F 3/044* (2006.01)
*H01L 51/52* (2006.01)
*H01L 27/32* (2006.01)
*G06F 3/041* (2006.01)

(52) U.S. Cl.
CPC ............ *G06F 3/044* (2013.01); *G06F 3/0416* (2013.01); *H01L 27/323* (2013.01); *H01L 27/3276* (2013.01); *H01L 51/5253* (2013.01); *G06F 3/0412* (2013.01)

(58) Field of Classification Search
None
See application file for complete search history.

(56) References Cited

U.S. PATENT DOCUMENTS

| 8,970,515 B2 | 3/2015 | Moran et al. | |
| 2016/0209942 A1* | 7/2016 | Yang | G06F 3/0412 |
| 2018/0097038 A1* | 4/2018 | Lee | G06F 3/0412 |

FOREIGN PATENT DOCUMENTS

KR   10-2011-0127236   11/2011

\* cited by examiner

*Primary Examiner* — Gustavo Polo
(74) *Attorney, Agent, or Firm* — H.C. Park & Associates, PLC

(57) ABSTRACT

A touch sensor includes a base layer, first touch sensor columns, second touch sensor columns, and sensing lines. The base layer includes a sensing region and a non-sensing region. The first touch sensor columns extend in a first direction. The first touch sensor columns include first touch electrodes. The first touch electrodes include sub-touch electrodes in the sensing region. The second touch sensor columns include second touch electrodes in the sensing region. The second touch sensor columns are alternately arranged with the first touch sensor columns. The sensing lines are in the non-sensing region. The sensing lines include: first sensing lines electrically connected to the sub-touch electrodes, and second sensing lines electrically connected to the second touch electrodes. The sub-touch electrodes and the second touch electrodes have different widths.

19 Claims, 14 Drawing Sheets ic # TOUCH SENSOR INCLUDING VARIOUS SENSING ELECTRODES OF DIFFERENT SIZES AND DISPLAY DEVICE INCLUDING THE TOUCH SENSOR

CROSS-REFERENCE TO RELATED APPLICATION

This application claims priority from and the benefit of Korean Patent Application No. 10-2017-0091991, filed Jul. 20, 2017, which is hereby incorporated by reference for all purposes as if fully set forth herein.

BACKGROUND

Field

Exemplary embodiments relate to a touch sensor, and, more particularly, to a touch sensor capable of improving a touch recognition rate and a display device including the touch sensor.

Discussion

Recent display devices have been developed to include an information input function along with an image display function. The information input function of the display devices may be generally implemented by a touch sensor for receiving user input. The touch sensor may be attached to one surface of a display panel that displays an image or be integrally formed with the display panel. A user may input information by pressing or touching the touch sensor while viewing an image displayed by the display panel.

The above information disclosed in this section is only for understanding the background of the inventive concepts, and, therefore, may contain information that does not form prior art.

SUMMARY

Some exemplary embodiments provide a touch sensor capable of improving a touch recognition rate.

Some exemplary embodiments also provide a display device including the touch sensor.

Additional aspects will be set forth in the detailed description which follows, and, in part, will be apparent from the disclosure, or may be learned by practice of the inventive concepts.

According to some exemplary embodiments, a touch sensor includes a base layer, first touch sensor columns, second touch sensor columns, and sensing lines. The base layer includes a sensing region and a non-sensing region. The first touch sensor columns extend in a first direction. The first touch sensor columns include first touch electrodes. The first touch electrodes include sub-touch electrodes in the sensing region. The second touch sensor columns include second touch electrodes in the sensing region. The second touch sensor columns are alternately arranged with the first touch sensor columns. The sensing lines are in the non-sensing region. The sensing lines include: first sensing lines electrically connected to the sub-touch electrodes, and second sensing lines electrically connected to the second touch electrodes. The sub-touch electrodes and the second touch electrodes have different widths.

According to some exemplary embodiments, a display device includes a display panel and a touch sensor disposed on at least one surface of the display panel. The touch sensor includes a base layer, first touch sensor columns, second touch sensor columns, and sensing lines. The base layer includes a sensing region and a non-sensing region. The first touch sensor columns extend in a first direction. The first touch sensor columns include first touch electrodes. The first touch electrodes include sub-touch electrodes in the sensing region. The second touch sensor columns include second touch electrodes in the sensing region. The second touch sensor columns are alternately arranged with the first touch sensor columns. The sensing lines are in the non-sensing region. The sensing lines include: first sensing lines electrically connected to the sub-touch electrodes, and second sensing lines electrically connected to the second touch electrodes. The sub-touch electrodes and the second touch electrodes have different widths.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
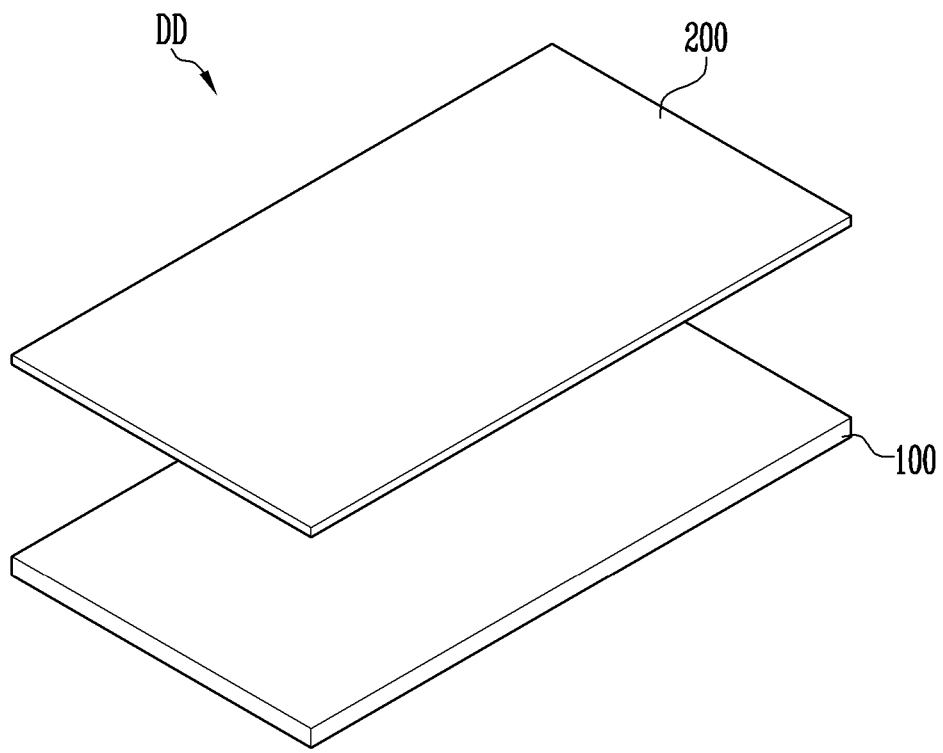
FIG. 1 is an exploded perspective view illustrating a display device including a touch sensor according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. Further, the DR1-axis and the DR2-axis are not limited to two axes of a rectangular coordinate system, and may be interpreted in a broader sense. For example, the DR1-axis and the DR2-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," "third," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Figure 2:
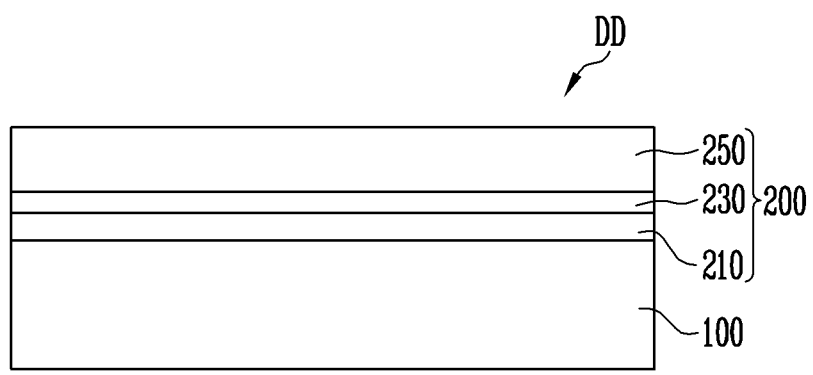
FIG. 2 is a schematic sectional view of the display device shown in FIG. 1 according to an exemplary embodiment.
Figure 3:
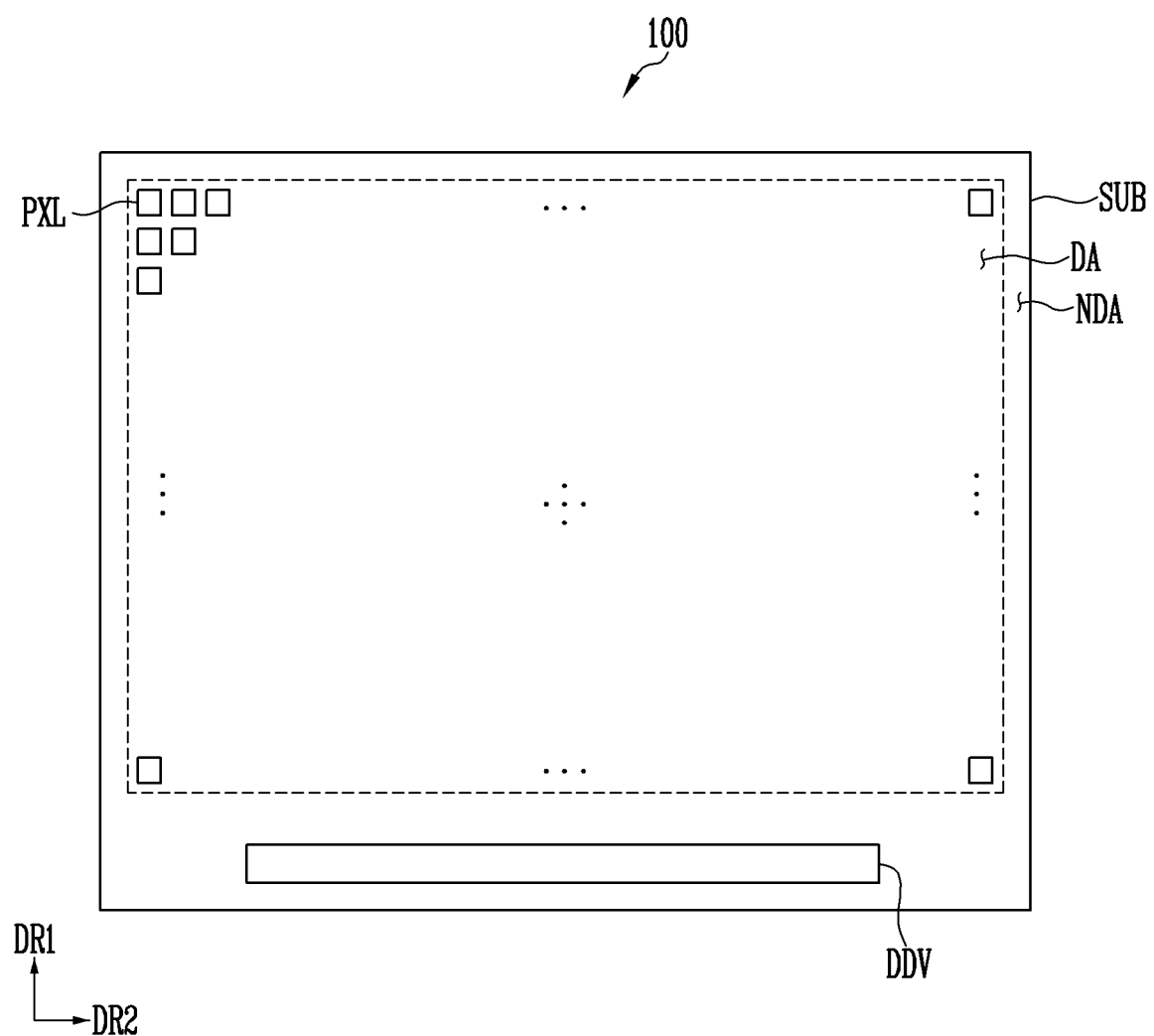
FIG. 3 is a plan view illustrating a display panel shown in FIG. 1 according to an exemplary embodiment.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein FIG. 1 is an exploded perspective view illustrating a display device including a touch sensor according to an exemplary embodiment. FIG. 2 is a schematic sectional view of the display device shown in FIG. 1 according to an exemplary embodiment. FIG. 3 is a plan view illustrating a display panel shown in FIG. 1 according to an exemplary embodiment.

Referring to FIGS. 1 to 3, the display device DD may include a display panel 100 and a touch sensor 200.

The display panel 100 may display an image. The display panel 100 is not particularly limited. For example, self-luminescent display panels, such as an organic light emitting display panel (OLED panel) may be used as the display panel 100. In addition, a non-luminescent display panel, such as a liquid crystal display panel (LCD panel), an electrophoretic display panel (EPD panel), and an electro-wetting display panel (EWD panel), etc., may be used as the display panel 100. When a non-luminescent display panel is used as the display panel 100, the display device DD may include a backlight unit (not shown) that supplies light to the display panel 100. Herein, a case where the OLED panel is used as the display panel 100 is described as an example.

The display panel 100 may include a substrate SUB including a display region DA and a non-display region NDA.

A plurality of pixels PXL may be provided in the display region DA on the substrate SUB. Each pixel PXL may be any one of a red pixel, a green pixel, a blue pixel, and a white pixel, but the disclosure is not limited thereto. For example, each pixel PXL may be any one of a magenta pixel, a cyan pixel, and a yellow pixel.

The non-display region NDA of the substrate SUB may be disposed at at least one side of the display region DA, and be disposed along the circumference of the display region DA. A pad unit (not shown), in which pads of lines are provided, and a data driver DDV that provides a data signal to the pixels PXL may be provided in the non-display region NDA. The data driver DDV may provide the data signal to each of the pixels PXL through data lines DL (see FIG. 4). Here, the data driver DDV may be disposed at a lateral part of the non-display region NDA, and extend long along a second direction DR2 of the non-display region NDA.

For convenience of description, a scan driver, an emission driver, and a timing controller are not illustrated in FIG. 3. However, the timing controller, the emission driver, and the scan driver may also be provided in the non-display region NDA, or otherwise connected to the display panel 100.

The substrate SUB may be made of an insulative material having flexibility. The substrate SUB may be provided in the substantially same shape corresponding to the shape of the touch sensor 200. The substrate SUB may be provided to have an area equal to that of the touch sensor 200 or to have an area larger than that of the touch sensor 200.

The substrate SUB may include a plurality of signal lines (not shown) connected to the plurality of pixels PXL and a plurality of transistors (not shown) connected to the plurality of signal lines.

Each of the plurality of pixels PXL may be an organic light emitting display element including an organic layer. However, the disclosure is not limited thereto, and the pixel PXL may be implemented in various forms, such as a liquid crystal display element, an electrophoretic display element, an electro-wetting display element, etc. Each of the plurality of pixels PXL is a minimum unit for displaying an image, and may be provided in plurality on the substrate SUB. In an exemplary embodiment, the pixel PXL may include an organic light emitting display element that emits white light and/or colored light.

As described above, each pixel PXL may include the plurality of signal lines, the plurality of transistors, and the organic light emitting device. A representative pixel PXL will be described later.

The touch sensor 200 may be disposed on at least one of both surfaces of the display panel 100. For example, the touch senor 200 may be disposed on a surface of the display panel 100 in the direction in which an image of the display panel 100 is emitted, to receive a touch input of a user. Also, the touch sensor 200 may be integrally formed with the display panel 100. For instance, the touch sensor 200 may be grown on a surface of the display panel 100 utilizing any suitable manufacturing technique, e.g., a deposition-based technique, a coating technique, etc. In other words, an adhesive may not be disposed between the touch sensor 200 and the display panel 100. In an exemplary embodiment, a case where the touch sensor 200 is provided on an upper surface of the display panel 200 is described as an example.

The touch sensor 200 may include a touch sensor layer 210 disposed on the upper surface of the display panel 100 and an insulating layer 230 disposed on the touch sensor layer 210.

The touch sensor layer 210 may recognize a touch event from the display device DD through a finger of a user or a separate input means, e.g., stylus, etc. In an exemplary embodiment, the touch sensor layer 210 may be driven using a mutual capacitance method. In the mutual capacitance method, a change in capacitance, caused by an interaction between two touch electrodes, is sensed. In addition, the touch sensor layer 210 may be driven using a self-capacitance method. In the self-capacitance method, when a user touches a region, a change in capacitance of a touch electrode in the touched region is sensed using touch electrodes arranged in a matrix shape and sensing lines connected to the respective sensing electrodes.

The touch sensor layer 210 may include the touch electrode, the sensing line connected to the touch electrode, and a pad unit connected to one side of the sensing line. The touch sensor layer 210 will be described later.

The insulating layer 230 may cover the touch sensor layer 210 and function to protect the touch sensor layer 210 from the outside. In some exemplary embodiments, the insulating layer 230 may include a material having elasticity and be deformed by a touch pressure of the user. In this case, the touch sensor layer 210 may additionally include a pressure electrode that forms a capacitor together with the touch electrode.

The touch sensor 200 may further include a window 250 disposed on the insulating layer 230.

The window 250 may be made of a transparent material. The window 250 may protect the exposed surface of the touch sensor 200. The window 250 allows an image from the display panel 100 to be transmitted therethrough, and simultaneously reduces impact from the outside so that it is possible to prevent the display panel 100 from being damaged or erroneously operated due to the impact from the outside. Here, the impact from the outside refers to a force from the outside, such as stress, which can cause a defect of the display panel 100. The whole or a least a portion of the window 250 may have flexibility.

Figure 4:
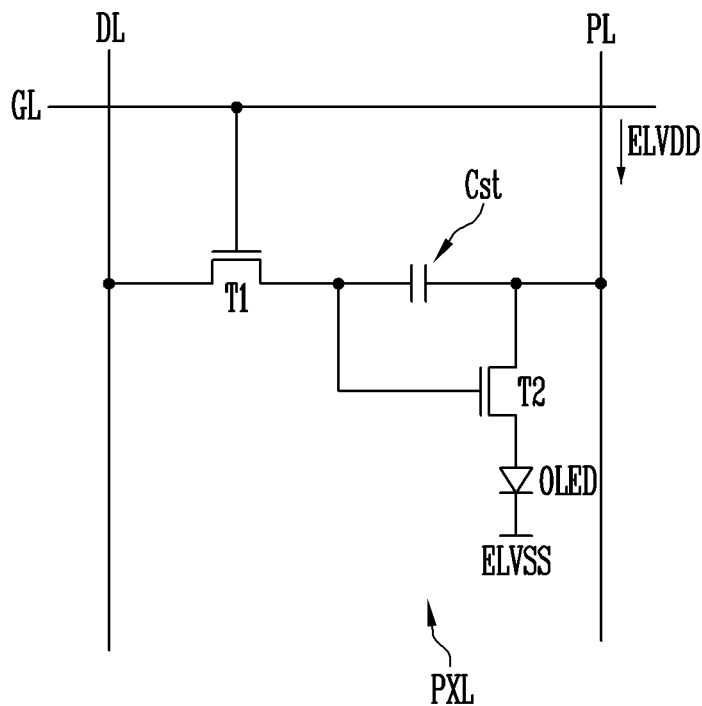
FIG. 4 is an equivalent circuit diagram illustrating one pixel among pixels shown in FIG. 3 according to an exemplary embodiment.

FIG. 4 is an equivalent circuit diagram illustrating one pixel among the pixels shown in FIG. 3 according to an exemplary embodiment. For convenience of description, one pixel PXL and lines connected to the pixel are mainly illustrated.

Referring to FIGS. 3 and 4, each pixel PXL may include a transistor connected to lines, a light emitting element OLED connected to the transistor, and a capacitor Cst. The light emitting element OLED may be a top emission type organic light emitting element, a bottom emission type organic light emitting element, or a top and bottom type organic light emitting element. The organic light emitting element may be an organic light emitting diode.

Each pixel PXL may include a first transistor (or switching transistor) T1, a second transistor (or driving transistor) T2, and the capacitor Cst, which constitute a pixel driving circuit for driving the light emitting element OLED. A first power voltage ELVDD may be transmitted to the second transistor T2 through a power line PL, and a second power voltage ELVSS may be transmitted to the light emitting element OLED. The second power voltage ELVSS may be set as a voltage lower than the first power voltage ELVDD.

The first transistor T1 outputs a data signal applied to a data line DL in response to a scan signal applied to a gate line GL. The capacitor Cst charges a voltage corresponding to the data signal received from the first transistor T1. The second transistor T2 is connected to the light emitting element OLED. The second transistor T2 controls a driving current flowing through the light emitting element OLED, corresponding to an amount of electric charges.

In an exemplary embodiment, a case where one pixel PXL includes two transistors T1 and T2 is described. However, the disclosure is not limited thereto, and one transistor and one capacitor may be included in one pixel PXL, or three or more transistors and/or two or more capacitors may be included in one pixel PXL. For example, one pixel PXL may include seven transistors and the light emitting element OLED, and the capacitor Cst.

Figure 5:
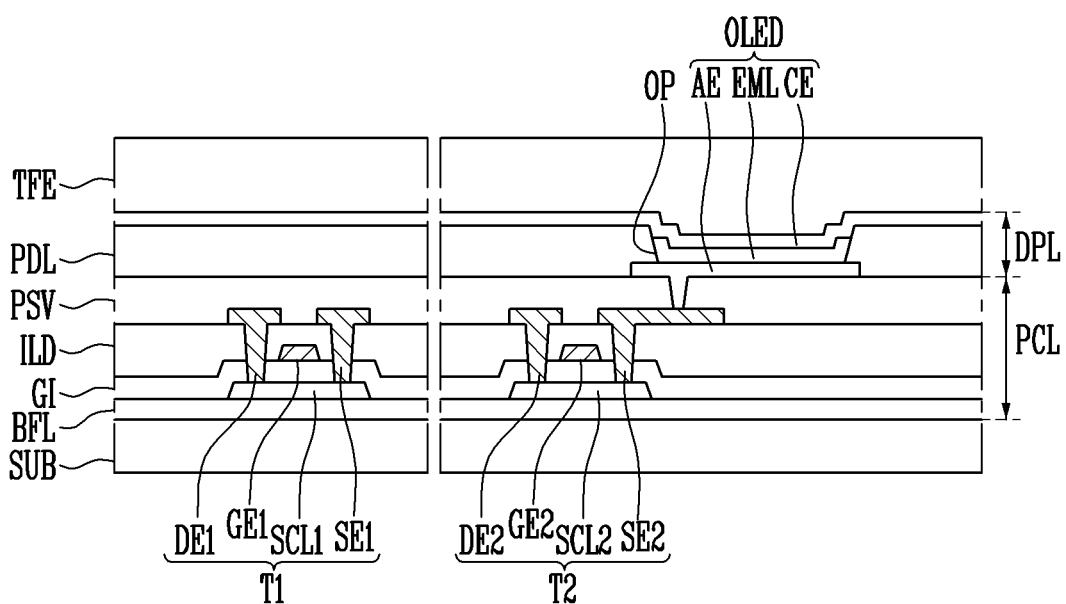
FIG. 5 is a sectional view illustrating a portion of a display panel according to an exemplary embodiment.

FIG. 5 is a sectional view illustrating a portion of a display panel according to an exemplary embodiment.

Referring to FIG. 5, the display panel 100 may include a substrate SUB, a pixel circuit unit PCL, a display element layer DPL, and a thin film encapsulation layer TFE.

The substrate SUB may be made of an insulative material, such as glass or resin, however, any suitable material may be utilized. Also, the substrate SUB may be made of a material having flexibility to be bendable or foldable, e.g., intentionally bendable or foldable without significant deterioration of designed characteristics, e.g., supportive characteristics. The substrate SUB may have a single or multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and the substrate SUB may be made of fiber glass reinforced plastic (FRP), or the like. In an exemplary embodiment, the substrate SUB may be made of a material having flexibility.

The pixel circuit unit PCL may include a buffer layer BFL disposed on the substrate SUB and first and second transistors T1 and T2 disposed on the buffer layer BFL.

The buffer layer BFL may prevent (or reduce) impurities from being diffused into the first and second transistors T1 and T2. The buffer layer BFL may be provided in a single layer, but may be provided in a multi-layer structure including at least two layers. When the buffer layer BFL is provided in the multi-layer structure, the layers may be formed of the same material or may be formed of different materials. The buffer layer BFL may be omitted according to the material and process conditions of the substrate SUB.

The first transistor T1 may be a switching transistor for switching of the second transistor T2. The second transistor T2 may be a driving transistor electrically connected to a light emitting element OLED of the display element layer DPL to drive the light emitting element OLED.

The first transistor T1 may include a first semiconductor layer SCL1, a first gate electrode GE1, a first source electrode SE1, and a first drain electrode DE1. The second transistor T2 may include a second semiconductor layer SCL2, a second gate electrode GE2, a second source electrode SE2, and a second drain electrode DE2.

The first and second semiconductor layers SCL1 and SCL2 may be disposed on the buffer layer BFL. The first and second semiconductor layers SCL1 and SCL2 may include source regions and drain regions, which are in contact with the first and second source electrodes SE1 and SE2 and the first and second drain electrodes DE1 and DE2, respectively. A region between the source region and the drain region may be a channel region. Each of the first and second semiconductor layers SCL1 and SCL2 may be a semiconductor pattern made of poly-silicon, amorphous silicon, oxide semiconductor, etc. The channel region is a semiconductor pattern undoped with impurities, and may be an intrinsic semiconductor. The source region and the drain region are semiconductor patterns doped with the impurities. The impurities may include impurities, such as an n-type impurity, a p-type impurity, and other metals.

The first gate electrode GE1 may be disposed on the first semiconductor layer SCL1 with a gate insulating layer GI interposed therebetween. The second gate electrode GE2 may be disposed on the second semiconductor layer SCL2 with the gate insulating layer GI interposed therebetween. Here, the gate insulating layer GI may be an inorganic insulating layer including an inorganic material. The inorganic material may include polysiloxane, silicon nitride, silicon oxide, silicon oxynitride, and the like.

The first source electrode SE1 and the first drain electrode DE1 may be in contact with the source region and the drain region of the first semiconductor layer SCL1 through contact holes passing through an interlayer insulating layer ILD and the gate insulating layer GI, respectively. The second source electrode SE2 and the second drain electrode DE2 may be in contact with the source region and the drain region of the second semiconductor layer SCL2 through contact holes passing through the interlayer insulating layer ILD and the gate insulating layer GI, respectively. The interlayer insulating layer ILD may be an inorganic insulating layer made of an inorganic material or an organic insulating layer made of an organic material.

The pixel circuit unit PCL may further include a passivation layer PSV disposed over the first and second transistors T1 and T2 to cover the first and second transistors T1 and T2. The passivation layer PSV may an inorganic insulating layer made of an inorganic material or an organic insulating layer made of an organic material.

The display element layer DPL may include the light emitting element OLED disposed on the passivation layer PSV. The light emitting element OLED may include a first electrode AE, a second electrode CE, and an emitting layer EML disposed between the first and second electrodes AE and CE. Here, any one of the first electrode AE and the second electrode CE may be an anode electrode, and the other of the first electrode AE and the second electrode CE may be a cathode electrode. For example, the first electrode AE may be an anode electrode and the second electrode CE may be a cathode electrode. When the light emitting element OLED is a top emission type organic light emitting element, the first electrode AE may be a reflective electrode, and the second electrode CE may be a transmissive electrode. In an exemplary embodiment, a case where the light emitting element OLED is a top emission type organic light emitting element, and the first electrode AE is an anode electrode and the second electrode CE is a cathode electrode is described as an example.

The first electrode AE may be connected to the second source electrode SE2 of the second transistor T2 through a contact hole passing through the passivation layer PSV. The first electrode AE may include a reflective layer (not shown) capable of reflecting light and a transparent conductive layer (not shown) disposed on the top or bottom of the reflective layer. At least one of the transparent conductive layer and the reflective layer may be electrically connected to the second source electrode SE2.

The display element layer DPL may further include a pixel defining layer PDL including an opening OP that exposes a portion of the first electrode AE, e.g., an upper surface of the first electrode AE, therethrough. The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, silane based resin, etc.

The emitting layer EML may be disposed on the exposed surface of the first electrode AE. The emitting layer EML may include a low-molecular or high-molecular material. In an exemplary embodiment, the low-molecular material may include copper phthalocyanine (CuPc), N,N'-Di(naphthalene-1-yl)-N,N'-diphenyl-benzidine (NPB), tris-8-hydroxyquinoline aluminum ($Alq_3$), and/or the like. The high-molecular material may include poly(3,4-ethylenedioxythiophene) (PEDOT)-, poly(phenylene-vinylene) (PPV)-, and/or poly(fluorine)-based materials.

The emitting layer EML may be provided as a single layer, but may be provided as a multi-layer structure including various functions. When the emitting layer EML is provided as a multi-layer structure, the emitting layer EML may have a structure in which a hole injection layer, a hole transport layer, an emission layer, an electron transport layer, an electron injection layer, and the like are stacked in a single or complex structure. The disclosure is not necessarily limited thereto, and the emitting layer ELM may have various structures. In addition, at least a portion of the emitting layer ELM may be integrally formed throughout or in association with, e.g., on, a plurality of first electrodes AE, or may be individually provided to correspond to each of the plurality of first electrodes AE. The color of light generated in (or by) the emitting layer EML may be one of red, green, blue, and white, but the disclosure is not limited thereto. For example, the color of light generated in a light generation layer of the emitting layer EML may be one of magenta, cyan, and yellow.

The second electrode CE may be disposed on the emitting layer EML. The second electrode CE may be a semi-transmissive reflective layer. For example, the second electrode CE may be a thin metal layer having a thickness, through which light emitted through the emitting layer EML can be transmitted. The second electrode CE may transmit a portion of the light emitted from the emitting layer EML therethrough, and may reflect the rest of the light emitted from the emitting layer EML.

The thin film encapsulation layer TFE may be provided over the light emitting element OLED.

The thin film encapsulation layer TFE may be provided in a single layer, but may be provided in a multi-layer structure. The thin film encapsulation layer TFE may include a plurality of insulating layers that cover the light emitting element OLED. For instance, the thin film encapsulation layer TFE may include one or more inorganic layers and/or one or more organic layers. For example, the thin film encapsulation layer TFE may have a structure in which the inorganic layers and the organic layers are alternately stacked. As another example, the thin film encapsulation layer TFE may include more inorganic layers than organic layers, or vice versa. In some exemplary embodiments, the thin film encapsulation layer TFE may be an encapsulating substrate that is disposed over the light emitting element OLED and is joined with the substrate SUB through a sealant.

Although not illustrated, the display panel 100 may also include one or more functional layers between the second electrode CE and the thin film encapsulation layer TFE, such as a capping layer, an optical layer, etc. One or more of the functional layers may be formed of an organic, inorganic, metal oxide, etc., materials.

Figure 6:
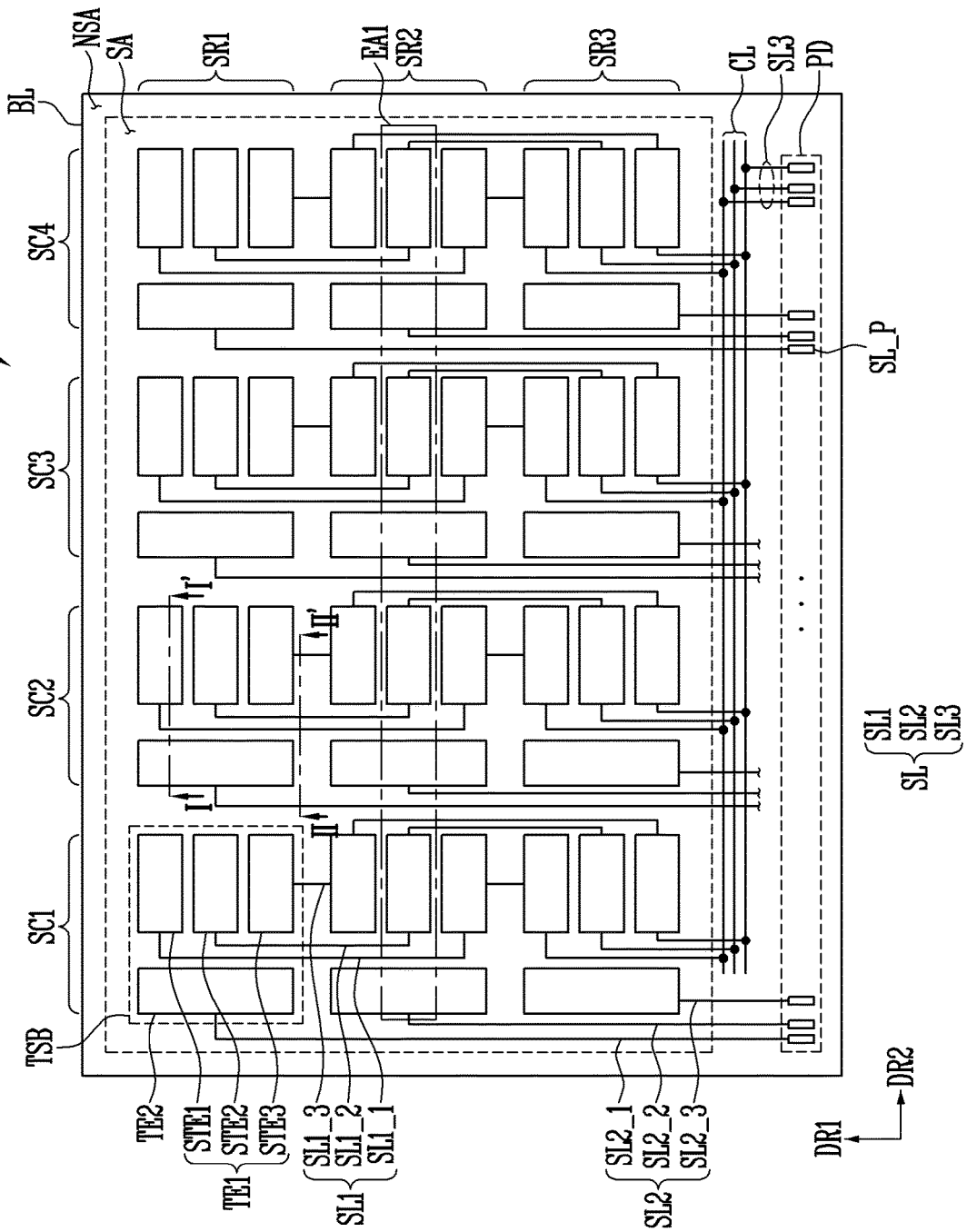
FIG. 6 is a plan view illustrating a touch sensor layer shown in FIG. 2 according to an exemplary embodiment.
Figure 7:
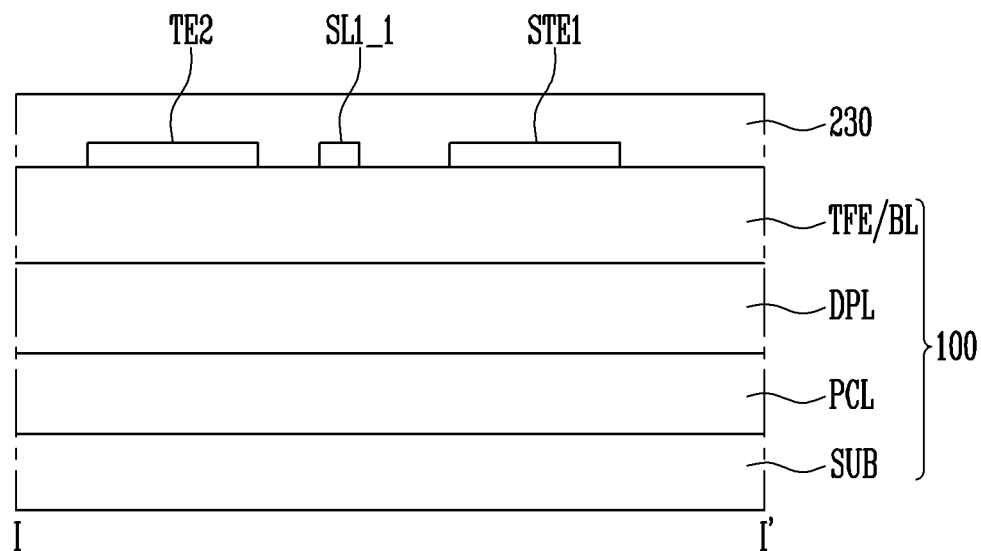
FIG. 7 is a sectional view taken along line sectional I-I' of FIG. 6 according to an exemplary embodiment.
Figure 8:
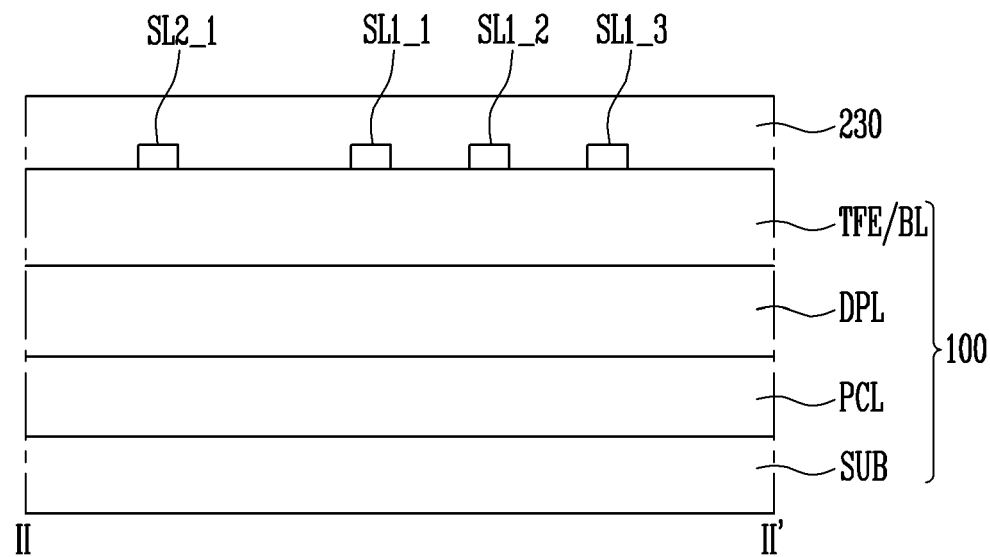
FIG. 8 is a sectional view taken along sectional line II-II' of FIG. 6 according to an exemplary embodiment.
Figure 9:
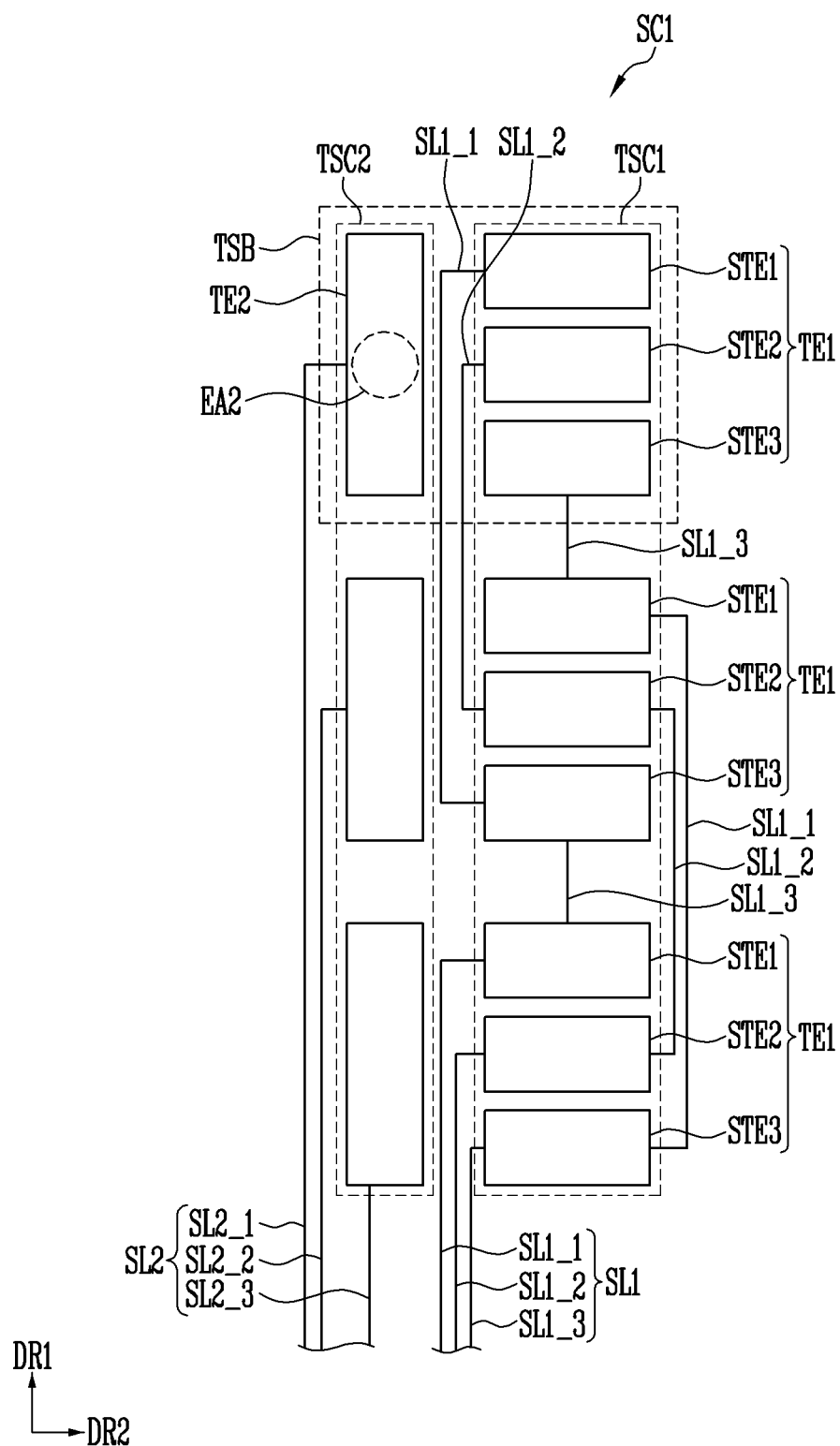
FIG. 9 is a plan view illustrating a first sensor column shown in FIG. 6 according to an exemplary embodiment.
Figure 10:
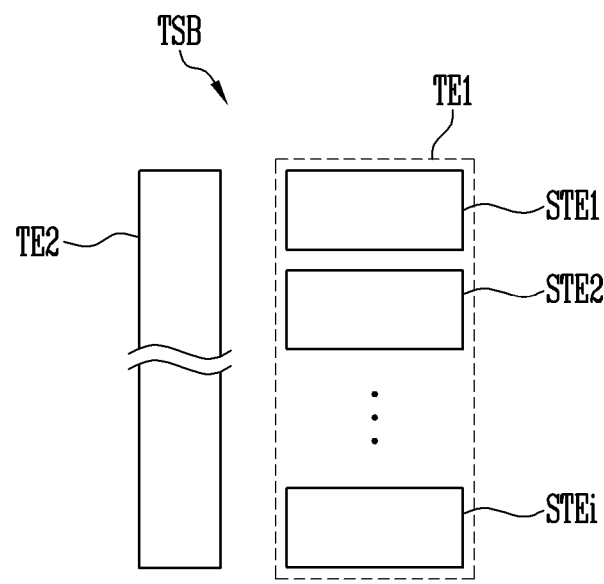
FIG. 10 is a plan view illustrating a touch sensor block shown in FIG. 9 according to an exemplary embodiment.
Figure 11:
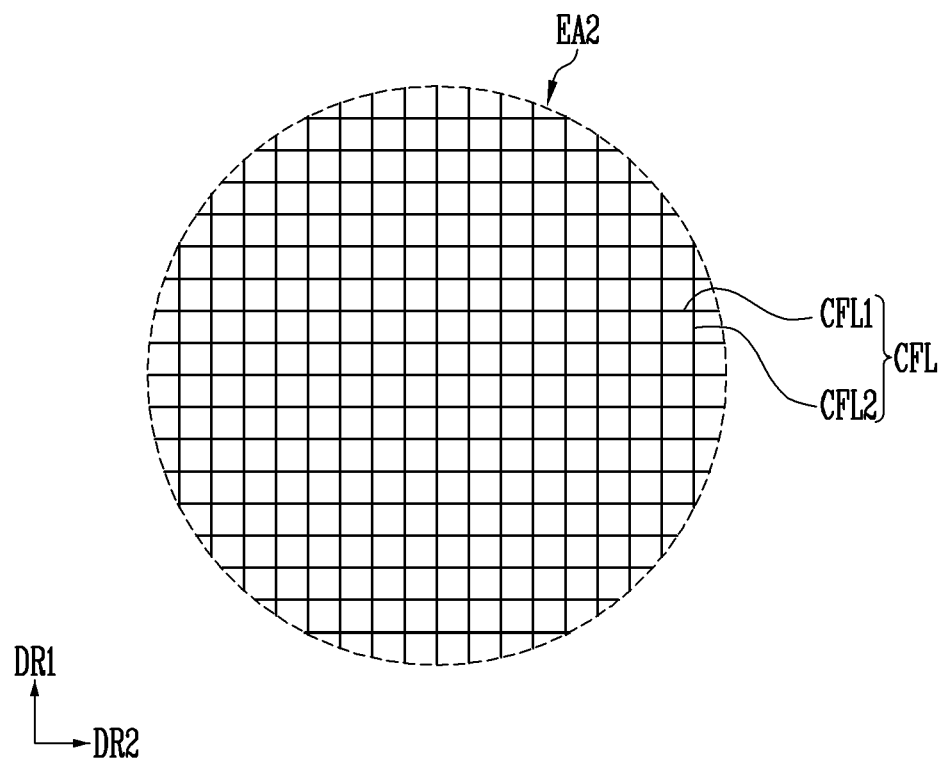
FIG. 11 is an enlarged view of region EA2 of FIG. 9 according to an exemplary embodiment.

FIG. 6 is a plan view illustrating the touch sensor layer shown in FIG. 2 according to an exemplary embodiment. FIG. 7 is a sectional view taken along sectional line I-I' of FIG. 6 according to an exemplary embodiment. FIG. 8 is a sectional view taken along sectional line II-II' of FIG. 6 according to an exemplary embodiment. FIG. 9 is a plan view illustrating a first sensor column shown in FIG. 6 according to an exemplary embodiment. FIG. 10 is a plan view illustrating a touch sensor block shown in FIG. 9 according to an exemplary embodiment. FIG. 11 is an enlarged view of region EA2 of FIG. 9 according to an exemplary embodiment.

Referring to FIGS. 2 and 6 to 11, the touch sensor layer 210 may include a base layer BL including a sensing region SA and a non-sensing region NSA.

The base layer BL may be made of an insulative material having flexibility. The base layer BL may be provided in the substantially same shape corresponding to the shape of the display panel 100. In an exemplary embodiment, the base layer BL may be a portion of the thin film encapsulation layer TFE of the display panel 100. For instance, the base layer BL may be an inorganic layer disposed as the uppermost layer of the thin film encapsulation layer TFE.

The sensing region SA may correspond to the display region (see DA of FIG. 3) of the display panel 100, and may be substantially provided in the same shape as the display region DA. The non-sensing region NSA may be disposed adjacent to the sensing region SA. Also, the non-sensing region NSA may correspond to the non-display region (see NDA of FIG. 3) of the display panel 100.

A plurality of touch sensor blocks TSB may be arranged in the sensing region SA, and a plurality of sensing lines SL and a pad unit PD may be arranged in the non-sensing region NSA.

The touch sensing blocks TSB may define a plurality of sensor columns SC1 to SC4 and/or define a plurality of sensor rows SR1 to SR3. Each of the plurality of sensor columns SC1 to SC4 may include a plurality of touch sensor blocks TSB arranged in a first direction DR1 (e.g., a column direction). Each of the plurality of sensor rows SR1 to SR3 may include a plurality of touch sensor blocks TSB arranged in a second direction DR2 (e.g., a row direction) intersecting the first direction DR1. In FIG. 6, it is illustrated that the touch sensor blocks TSB are arranged in a matrix form, but the disclosure is not limited thereto.

Each of the plurality of sensor columns SC1 to SC4 may include a first touch sensor column TSC1 including a plurality of first touch electrodes TE1 arranged along the first direction DR1 and a second touch sensor column TSC2 including a plurality of second touch electrodes TE2 arranged along the first direction DR1. The first touch sensor column TSC1 and the second touch sensor column TSC2 may be alternately arranged in the sensing region SA.

Each first touch electrode TE1 may include a plural number, e.g., i (i is a natural number of 2 or more) sub-touch electrodes disposed to be spaced apart from each other. For example, one first touch electrode TE1 may include three sub-touch electrodes STE1, STE2, and STE3. The three sub-touch electrodes STE1, STE2, and STE3 may include a first sub-touch electrode STE1, a second sub-touch electrode STE2, and a third sub-touch electrode STE3. Here, the first to third sub-touch electrodes STE1, STE2, and STE3 may be sequentially arranged along the extending direction of the first touch sensor column TSC1. That is, among the first to third sub-touch electrodes STE1, STE2, and STE3, the first sub-touch electrode STE1 may be disposed most distant from the pad unit PD, and the third sub-touch electrode STE3 may be disposed closest to the pad unit PD.

The first to third sub-touch electrodes STE1, STE2, and STE3 may be connected to a corresponding sensing line SL. For instance, the first to third sub-touch electrodes STE1, STE2, and STE3 may be electrically connected to first sensing lines SL1 of the sensing lines SL. The first sensing lines SL1 may be disposed between the first touch sensor column TSC1 and the second touch sensor column TSC2. The first to third sub-touch electrodes STE1, STE2, and STE3 may be connected to first to third sub-touch electrodes STE1, STE2, and STE3 corresponding to an adjacent first touch electrode TE1 on the same first touch sensor column TSC1 through the first sensing lines SL1.

In an exemplary embodiment, the first sensing lines SL1 may include first sensing lines SL1_1, SL1_2, and SL1_3 of which the number is equal to that of sub-touch electrodes provided in the first touch electrode TE1. For example, if one first touch electrode TE1 includes three sub-touch electrodes, e.g., the first to third sub-touch electrodes STE1, STE2, and STE3, the first sensing lines SL1 may include three first sensing lines SL1_1, SL1_2, and SL1_3. Here, the three first sensing lines SL1_1, SL1_2, and SL1_3 may include a (1-1)-th sensing line SL1_1, a (1-2)-th sensing line SL1_2, and a (1-3)-th sensing line SL1_3.

As shown in FIG. 9, when three first touch electrodes TE1 each including three sub-touch electrodes STE1, STE2, and ST3 are arranged on the first touch sensor column TSC1, the connection relationship between the first sensing lines SL1 and the first touch electrodes TE1 may be as follows, but the disclosure is not limited thereto.

A first sub-touch electrode STE1 of a first touch electrode TE1 disposed at an upper side of the first touch sensor column TSC1 may be connected to a third sub-touch electrode STE3 of a first touch electrode TE1 disposed at the center of the first touch sensor column TSC1 through a corresponding (1-1)-th sensing line SL1_1. In addition, the third sub-touch electrode STE3 of the first touch electrode TE1 disposed at the center of the first touch sensor column TSC1 may be connected to a first sub-touch electrode STE1 of a first touch electrode disposed at a lower side of the first touch sensor column TSC1 through a corresponding (1-3)-th sensing line SL1_3. In addition, the first sub-touch electrode STE1 of the first touch electrode TE1 disposed at the lower side of the first touch sensor column TSC1 may be connected to a corresponding pad SL_P of the pad unit PD through a corresponding (1-1)-th sensing line SL1_1.

A second sub-touch electrode STE2 of the first touch electrode TE1 disposed at the upper side of the first touch sensor column TSC1 may be connected to a second sub-touch electrode STE2 of the first touch electrode TE1 disposed at the center of the first touch sensor column TSC1 through a corresponding (1-2)-th sensing line SL1_2. In addition, the second sub-touch electrode STE2 of the first touch electrode TE1 disposed at the center of the first touch sensor column TSC1 may be connected to a second sub-touch electrode STE2 of the first touch electrode TE1 disposed at the lower side of the first touch sensor column TSC1 through a corresponding (1-2)-th sensing line SL1_2. In addition, the second sub-touch electrode STE2 of the first touch electrode TE1 disposed at the lower side of the first touch sensor column TSC1 may be connected to a corresponding pad SL_P of the pad unit PD through a corresponding (1-2)-th sensing line SL1_2.

A third sub-touch electrode STE3 of the first touch electrode TE1 disposed at the upper side of the first touch sensor column TSC1 may be connected to a first sub-touch electrode STE1 of the first touch electrode TE1 disposed at the center of the first touch sensor column TSC1 through a corresponding (1-3)-th sensing line SL1_3. In addition, the first sub-touch electrode STE1 of the first touch electrode TE1 disposed at the center of the first touch sensor column TSC1 may be connected to a third sub-touch electrode STE3 of the first touch electrode TE1 disposed at the lower side of the first touch sensor column TSC1 through a corresponding (1-1)-th sensing line SL1_1. In addition, the third sub-touch electrode STE3 of the first touch electrode TE1 disposed at the lower side of the first touch sensor column TSC1 may be connected to a corresponding pad SL_P of the pad unit PD through a corresponding (1-3)-th sensing line SL1_3.

The (1-1)-th to (1-3)-th sensing lines SL1_1, SL1_2, and SL1_3 may extend from the sensing region SA to the non-sensing region NSA along the first direction DR1.

The second touch sensor column TSC2 may include q (q is a natural number of 2 or more) second touch electrodes TE2. The second touch electrodes TE2 may be arranged in the extending direction of the second touch senor column TSC2. The second touch electrodes TE2 may be electrically connected to second sensing lines SL2 of the sensing line SL. The number of the second sensing lines SL2 corresponding to the second touch sensing column TSC2 may be equal to that of the second touch electrodes TE2. In an exemplary embodiment, the number of the second sensing lines SL2 corresponding to the second touch sensor column TSC2 may be q. For example, when three second touch electrodes TE2 are arranged on (or in) the second touch sensor column TSC2, the number of the second sensing lines SL2 may be three. For instance, the second sensing lines SL2 may include a (2-1)-th sensing line SL2_1 connected to a second touch electrode TE2 disposed at an upper side of one second touch sensor column TSC2, a (2-2)-th sensing line SL2_2 connected to a second touch electrode TE2 disposed at the center of the second touch sensor column TSC2, and a (2-3)-th sensing line SL2_3 connected to a second touch electrode TE2 disposed at a lower side of the second touch sensor column TSC2.

One of the first touch electrodes TE1 and the second touch electrodes TE2, e.g., the first touch electrodes TE1, may be touch driving electrodes that receive a touch driving signal, and the other of the first touch electrodes TE1 and the second touch electrodes TE2, e.g., the second touch electrodes TE2, may be touch receiving electrodes that output a touch sensing signal. The touch sensor layer 210 may recognize a touch of a user by sensing a variation dCm in mutual capacitance (hereinafter, referred to as "Cm") formed between the first touch electrodes TE1 and the second touch electrodes TE2.

The first touch electrodes TE1 and the second touch electrodes TE2 may sense a change in mutual capacitance Cm from a touch input of an object, such as a portion of the body of the user, a stylus pen, etc. In addition, the first touch electrodes TE1 and the second touch electrodes TE2 may include a conductive material to sense a change in mutual capacitance Cm. For example, the conductive material may include metals, alloys thereof, a conductive polymer, a conductive metal oxide, and/or the like.

In an exemplary embodiment, examples of the metals may be copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and/or the like. Examples of the conductive metal oxide may be indium tin oxide (ITO), indium zinc oxide (IZO), antimony zinc oxide (AZO), indium tin zinc oxide (ITZO), zinc oxide (ZnO), tin oxide ($SnO_2$), and/or the like.

In an exemplary embodiment, the first touch electrode TE1 and the second touch electrode TE2 may be provided in a single layer or a multi-layer structure. Examples of the conductive polymer may be polythiophene-based, polypyrrole-based, polyaniline-based, polyacetylene-based, and/or polyphenylene-based compounds, mixtures thereof, and the like. For example, a PEDOT/PSS compound among the polythiophene-based compounds may be used as the conductive polymer. The conductive polymer is easily prepared and has flexibility higher than that of the conductive metal oxide, e.g., ITO. Hence, the probability that cracks will occur in bending can be reduced.

The first sensing lines SL1 and the second sensing lines SL2 may transmit the change in mutual capacitance Cm, which is sensed by the first touch electrodes TE1 and the second touch electrodes TE2, to an external circuit (not shown) through the pad unit PD. Also, like the first touch electrodes TE1 and the second touch electrodes TE2, the first sensing lines SL1 and the second sensing lines SL2 may include a conductive material.

An insulating layer 230 may be provided over the first sensing lines SL1, the second sensing lines SL2, the first touch electrodes TE1, and the second touch electrodes TE2.

The second touch electrodes TE2 may include a plurality of conductive fine lines CFL as shown in FIG. 11. For example, the second touch electrodes TE2 may include a plurality of first conductive fine lines CFL1 that extend in the second direction DR2 and are parallel to one another, and a plurality of second conductive fine lines CFL2 that extend in the first direction DR1 and are parallel to one another. Due to the first conductive fine lines CFL1 and the second conductive fine lines CFL2, each of the second touch electrodes TE2 may have a mesh structure. The mesh structure may include a plurality of openings, e.g., regions formed as the first conductive fine lines CFL1 and the second conductive fine lines CFL2 intersect each other.

In FIG. 11, it is illustrated that each of the second touch electrodes TE2 has the mesh structure, but the disclosure is not limited thereto. For example, each of the first to third sub-touch electrodes STE1, STE2, and STE3 may also include the plurality of conductive fine lines CFL.

When the first to third sub-touch electrodes STE1, STE2, and STE3 and the second touch electrodes TE2 have the mesh structure, the area in which the first to third sub-touch electrodes STE1, STE2, and STE3 and the second touch electrodes TE2 overlap with the display panel 100 may be decreased by the openings. If the area in which the first to third sub-touch electrodes STE1, STE2, and STE3 and the second touch electrodes TE2 overlap with the display panel 100 is decreased, it is possible to prevent (or reduce) electromagnetic interference between the first to third sub-touch electrodes STE1, STE2, and STE3 and second touch electrodes TE2 and the display panel 100. Thus, the touch recognition rate of the touch sensor layer 210 can be improved.

The first conductive fine lines CFL1 and the second conductive fine lines CFL2 may include at least one of aluminum (Al), copper (Cu), chromium (Cr), nickel (Ni), gold (Au), platinum (Pt), and any alloy thereof. Also, the first conductive fine lines CFL1 and the second conductive fine lines CFL2 may include a transparent conductive oxide. Also, the first conductive fine lines CFL1 and the second conductive fine lines CFL2 may be provided in a multi-layer structure including two or more conductive layers.

The first touch electrodes TE1 and the second touch electrodes TE2 may be provided on the display panel 100. For instance, the first touch electrodes TE1 and the second touch electrodes TE2 may be disposed on the thin film encapsulation layer TFE of the display panel 100. The first touch electrodes TE1 and the second touch electrodes TE2 may be provided in the same layer. In an exemplary embodiment, a portion of the thin film encapsulation layer, e.g., an inorganic layer disposed as the uppermost layer, may be the base layer BL. Therefore, the first touch electrodes TE1 and the second touch electrodes TE2 may be provided in the same layer on the base layer BL.

In addition, the first sensing lines SL1 and the second sensing lines SL2 may also be provided on the display panel 100. For instance, the first sensing lines SL1 and the second sensing lines SL2 may be disposed on the thin film encapsulation layer TFE. The first sensing lines SL1 and the second sensing lines SL2 may be provided in the same layer. That is, the first and second sensing lines SL1 and SL2 may be provided in the same layer on the base layer BL.

In an exemplary embodiment, the first and second sensing lines SL1 and SL2 may be provided in the same layer as the first touch electrodes TE1 and the second touch electrodes TE2. Accordingly, a one-layer type touch sensor layer 210 can be implemented. As described above, if the first and second touch electrodes TE1 and TE2 and the first and second sensing lines SL1 and SL2 are provided in the same layer, the manufacturing process of the touch sensor layer 210 can be simplified, and the manufacturing cost of the touch sensor layer 210 can be reduced.

Also, in an exemplary embodiment, the numbers of the first and second touch electrodes TE1 and TE2 and the first and second sensing lines SL1 and SL2 may be decreased through a combination of the first and second touch electrodes TE1 and TE2. For example, the combination of the first and second touch electrodes TE1 and TE2 may be configured by allowing the second touch sensor column TSC2 to include a plurality of second touch electrodes TE2 and performing matching such that three sub-touch electrodes STE1, STE2, and STE3 into which each of the second touch electrodes TE2 is divided are adjacent to each other. Accordingly, the number of the first and second touch electrodes TE1 and TE2 is minimized within a range where the resolution of the display device is ensured so that the number of the first and second sensing lines SL1 and SL2 can be effectively decreased.

The pad unit PD may include a plurality of pads SL_P. The pads SL_P may be electrically connected to the first touch electrodes TE1 and the second touch electrodes TE2 through the first sensing lines SL1 and the second sensing lines SL2.

A contact line CL electrically connected to the first sensing lines SL1 and a third sensing line SL3, which connects the contact line CL and the pad unit PD, may be disposed in the non-sensing region NSA. The contact line CL may be provided in a number equal to that of sub-touch electrodes STE1, STE2, and STE3 provided in one first touch electrode TE1. That is, i contact lines CL may be provided. In an exemplary embodiment, the contact line CL may be provided with three contact lines CL. The contact line CL may be electrically connected to a corresponding pad SL_P of the pad unit PD through the third sensing line SL3.

The third sensing line SL3 may be provided in a number equal to that of the contact lines CL. That is, i third sensing lines SL3 may be provided. The i third sensing lines SL3 may be connected to corresponding contact lines CL through contact holes.

Figure 12:
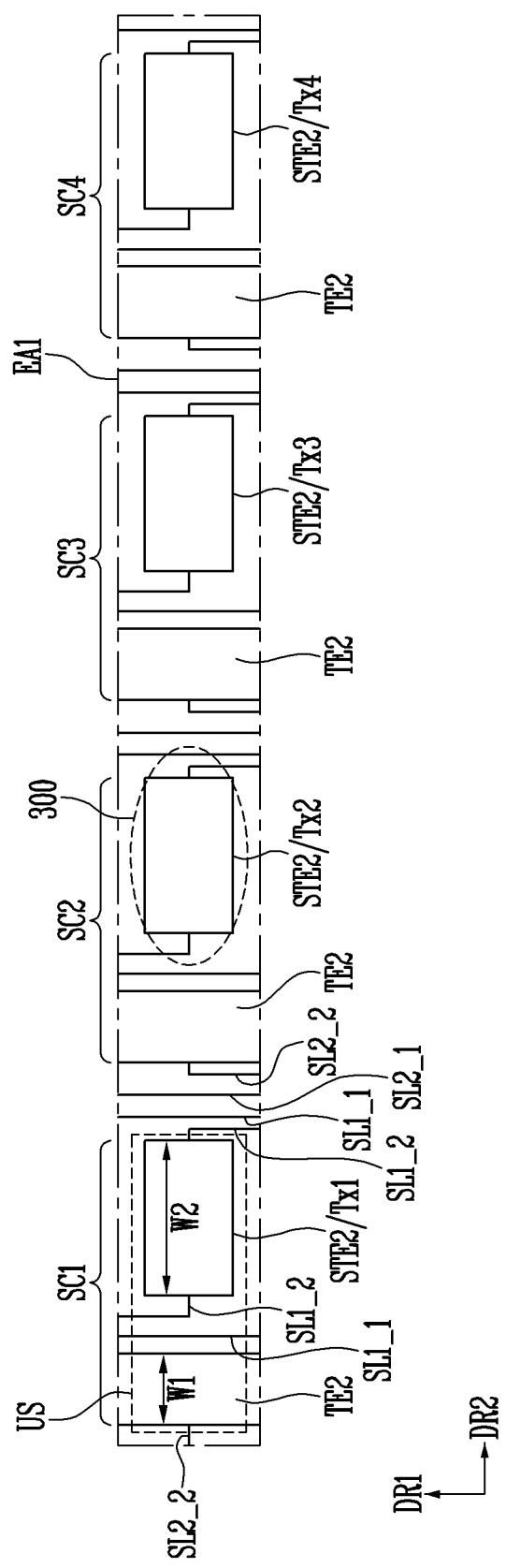
FIG. 12 is an enlarged view of region EA1 of FIG. 6 according to an exemplary embodiment.

FIG. 12 is an enlarged view of region EA1 of FIG. 6 according to an exemplary embodiment.

Referring to FIGS. 6 and 12, the touch sensor layer 210 may include a base layer BL, first to fourth sensor columns SC1 to SC4 provided in a sensing region SA of the base layer BL, and first and second sensing lines SL1 and SL2 corresponding to the first to fourth sensor columns SC1 to SC4.

Each of the first to fourth sensor columns SC1 to SC4 may include a first touch sensor column (see TSC1 of FIG. 9) having first touch electrodes TE1 and a second touch sensor column (see TSC2 of FIG. 9) having second touch electrodes TE2. The first touch sensor column TSC1 and the second touch sensor column TSC2 may be alternately disposed in the sensing region SA. Therefore, the first touch electrodes TE1 and the second touch electrodes TE2 may also be alternately disposed in the sensing region SA.

The first touch electrode TE1 may include first to third sub-touch electrodes STE1, STE2, and STE3 sequentially arranged along a first direction DR1. The first to third sub-touch electrodes STE1, STE2, and STE3 may be connected to the first sensing lines SL1. The second touch electrodes TE2 may be connected to the second sensing lines SL2.

In an exemplary embodiment, a unit sensor US may be configured with a combination of one region of the second touch electrode TE2 connected to one second sensing line SL2 and one sub-touch electrode adjacent thereto. For instance, one sub-touch electrode disposed on the first touch sensor column TSC1 and one region of one second touch electrode TE2 disposed adjacent to the right side and/or the left side of the one sub-touch electrode may constitute one unit sensor US. For example, as shown in FIG. 12, one unit sensor US may be configured with a combination of a second sub-touch electrode STE2 and one region of one second touch electrode TE2 disposed adjacent to the left side of the second sub-touch electrode STE2. In addition, one unit sensor US may be configured with a combination of the second sub-touch electrode STE2 and one region of one second touch electrode TE2 disposed adjacent to the right side of the second sub-touch electrode STE2. The positions of the first and second sensing lines SL1 and SL2 connected to the unit sensor US may be changed depending on the position of the unit sensor US.

In some exemplary embodiments, the lateral and longitudinal lengths of each unit sensor US may be substantially equal or similar to each other.

A mutual capacitance Cm may be formed between the second touch electrode TE2 and each of the first to third sub-touch electrodes STE1, STE2, and STE3, which are disposed adjacent to each other. When a touch input of a user occurs, the magnitude of the mutual capacitance Cm between the second touch electrode TE2 and each of the first to third sub-touch electrodes STE1, STE2, and STE3, which are disposed in the region in which the touch input occurs, is changed, and the touch input may be sensed by detecting a variation dCm in mutual capacitance Cm. For example, when a second sub-touch electrode STE2 of a first touch electrode TE1 disposed at the center of the second sensor column SC2 is touched by a conductive rod 300 (including a finger of a user, a stylus pen, or the like), the magnitude of a mutual capacitance Cm between the second sub-touch electrode STE2 and a second touch electrode TE2 disposed adjacent thereto may be changed. The touch sensor layer 210 may sense a touch input caused by the conductive rod 300 by detecting a variation dCm in mutual capacitance Cm.

In an exemplary embodiment, the size of each of the first to third sub-touch electrodes STE1, STE2, and STE3 and the size of the second touch electrode TE2 may be designed to be different from each other. For example, the size of the second touch electrode TE2 (or a portion of the second touch electrode TE2 forming a portion of a unit sensor US) may be smaller than that of each of the first to third sub-touch electrodes STE1, STE2, and STE3. In this case, the first to third sub-touch electrodes STE1, STE2, and STE3 may have the same size.

As shown in FIG. 12, the second touch electrode TE2 may have a first width W1 in a second direction DR2, and the second sub-touch electrode STE2 may have a second width W2 in the second direction DR2. The first width W1 and the second width W2 may be different from each other. For example, the second width W2 may be larger than the first width W1. Consequently, the width of each of the first to third sub-touch electrodes STE1, STE2, and STE3 in the second direction DR2 may be larger than that of the second touch electrode TE2 in the second direction DR2. In FIG. 12, it is illustrated that only the second sub-touch electrode STE2 has the second width W2, but the disclosure is not limited thereto. Like the second sub-touch electrode STE2, the first to third sub-touch electrodes STE1, STE2, and STE3 may be designed to have the second width W2.

In an exemplary embodiment, the first width W1 may be approximately half of the second width W2, but the disclosure is not limited thereto. For example, the ratio of the first width W1 to the second width W2 may be approximately 1:1.6 to 1:2.6.

Herein, for convenience of description, a second sub-touch electrode STE2 of a first touch electrode TE1 disposed at the center of the first sensor column SC1 is designated as a first Tx electrode STE2/Tx1 (hereinafter, referred to as "Tx1"), and a second sub-touch electrode STE2 of a first touch electrode TE1 disposed at the center of the second sensor column SC2 is designated as a second Tx electrode STE2/Tx2 (hereinafter, referred to as "Tx2"). In addition, a second sub-touch electrode STE2 of a first touch electrode TE1 disposed at the center of the third sensor column SC3 is designated as a third Tx electrode STE2/Tx3 (hereinafter, referred to as "Tx3"), and a second sub-touch electrode STE2 of a first touch electrode TE1 disposed at the center of the fourth sensor column SC4 is designated as a fourth Tx electrode STE2/Tx4 (hereinafter, referred to as "Tx4").

When the second Tx electrode Tx2 is touched by the conductive rod 300, a mutual capacitance Cm formed between the second Tx electrode Tx2 and a second touch electrode TE2 adjacent thereto may be changed. For instance, the second Tx electrode Tx2 directly touched (e.g., is disposed under the touch point of the conductive rod 300) by the conductive rod 300 may become a maximum node (Max node) at which the variation dCm in capacitance Cm is largest.

When the second Tx electrode Tx2 is touched by the conductive rod 300, a side signal may be formed between the conductive rod 300 and each of Tx electrodes adjacent to the second Tx electrode Tx2, e.g., the first Tx electrode Tx1 and the third Tx electrode Tx3. The side signal may include a mutual capacitance Cm between the conductive rod 300 and the first Tx electrode Tx1 and a mutual capacitance Cm between the conductive rod 300 and the third Tx electrode Tx3 when the second Tx electrode Tx2 is touched by the conductive rod 300. The side signal may be used to recognize continuity of a touch input when the conductive rod 300 is moved along one direction on the touch sensor layer 210, e.g., when the touch input is continuously performed (e.g., a dragging touch interaction).

If the distance between the conductive rod 300 and the first Tx electrode Tx1 and the distance between the conductive rod 300 and the third Tx electrode Tx3 decrease, the side signal at the second Tx electrode Tx2 may increase. In other words, if the distance between the second Tx electrode Tx2 located at the Max node and the first Tx electrode Tx1 adjacent thereto and the distance between the second Tx electrode Tx2 and the third Tx electrode Tx3 adjacent thereto decrease, the side signal may increase. That is, the side signal at the Max node may increase. When the side signal increases at the Max node, a touch input of the conductive rod 300, which is continuously performed, is recognized without stop such that the accuracy of a touch recognition rate can be improved.

In a conventional touch sensor layer in which the first to fourth Tx electrodes Tx1, Tx2, Tx3, and Tx4 have the first width W1 that is equal to the width of the second touch electrode TE2, the distance between adjacent Tx electrodes may be large as compared with the touch sensor layer 210 according to various exemplary embodiments. Also, in conventional touch sensor layers, if one Tx electrode is touched by the conductive rod 300, the distance between a Tx electrode adjacent to the touched Tx electrode and the conductive rod 300 may be large as compared with the touch sensor layer 210 according to various exemplary embodiments. Therefore, a side signal formed between the conductive rod 300 and a Tx electrode adjacent to the touched Tx electrode may decrease. If the side signal decreases, the touch coordinate of a region in which a touch input is caused by the conductive rod 300 may not be calculated or determined. For instance, a continuously performed touch input may not be recognized.

Accordingly, in various exemplary embodiments, the width of each of the first to fourth Tx electrodes Tx1 to Tx4 is designed to be larger than that of the second touch electrode TE2 so that the distance between adjacent Tx electrodes can be decreased as compared with conventional touch sensor layers. Thus, when the second Tx electrode Tx2 is touched by the conductive rod 300, the distance between the first Tx electrode Tx1 adjacent to the second Tx electrode Tx2 and the conductive rod 300 decreases so that the side signal formed between the first Tx electrode Tx1 adjacent to the second Tx electrode Tx2 and the conductive rod 300 can increase. Similarly, when the second Tx electrode Tx2 is touched by the conductive rod 300, the distance between the third Tx electrode Tx3 adjacent to the second Tx electrode Tx2 and the conductive rod 300 decreases so that the side signal formed between the third Tx electrode Tx3 adjacent to the second Tx electrode Tx2 and the conductive rod 300 can increase.

Consequently, according to various exemplary embodiments, when the second Tx electrode Tx2 is touched by the conductive rod 300, the side signal formed between the conductive rod 300 and each of the first and third Tx electrodes Tx1 and Tx3 adjacent to the second Tx electrode Tx2 increases so that a continuously performed touch input can be accurately recognized. Accordingly, the touch recognition rate of the touch sensor layer 210 according to various exemplary embodiments can be improved.

Hereinafter, a side signal and a variation in mutual capacitance according to a change in width of a sub-touch electrode will be described with reference to FIGS. 13 and 14. Here, the side signal may mean a mutual capacitance formed between a sub-touch electrode adjacent to one sub-touch electrode and a conductive rod when the one sub-touch electrode is touched by the conductive rod, and the variation in mutual capacitance may mean a variation in mutual capacitance according to a touch of a user.

Figure 13:
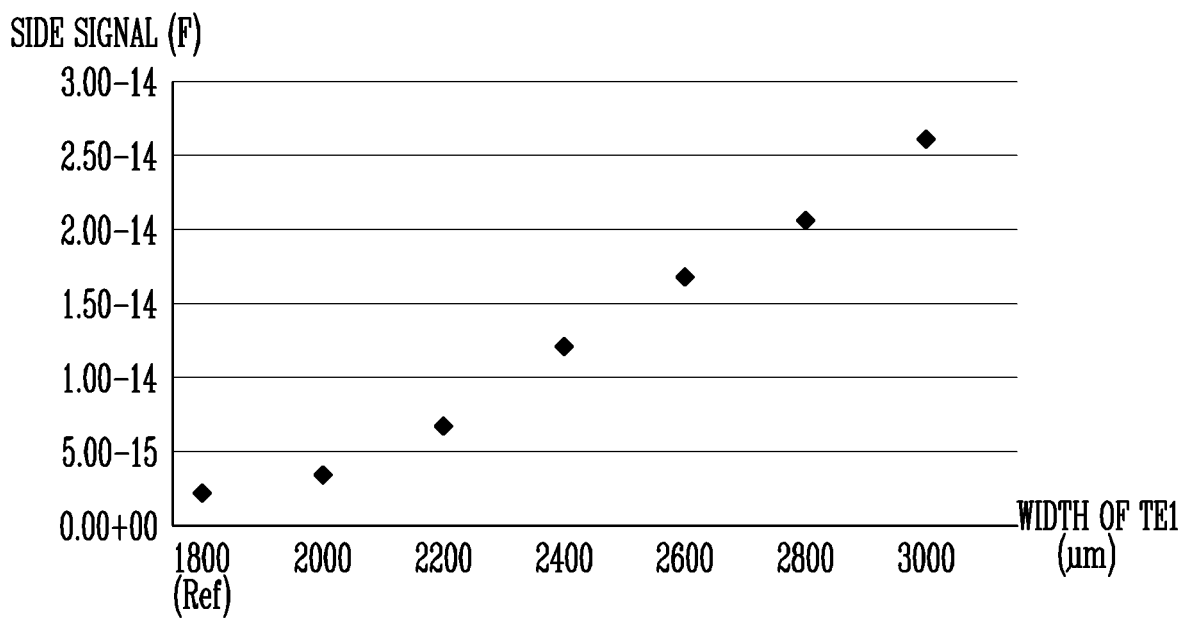
FIG. 13 is a graph illustrating side signal of a sub-touch electrode adjacent to one sub-touch electrode according to change in width of the one sub-touch electrode according to an exemplary embodiment.
Figure 14:
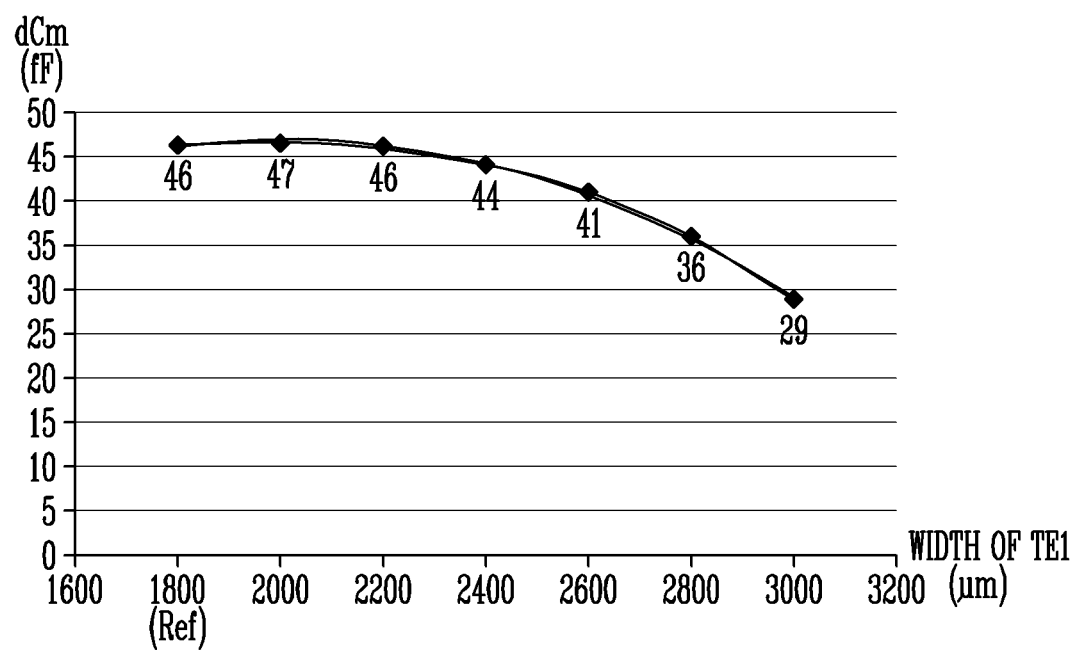
FIG. 14 is a graph illustrating variation in capacitance between one sub-touch electrode and a second touch electrode according to change in width of the one sub-touch electrode according to an exemplary embodiment.

FIG. 13 is a graph illustrating side signal of a sub-touch electrode adjacent to one sub-touch electrode according to change in width of the one sub-touch electrode according to an exemplary embodiment. FIG. 14 is a graph illustrating variation in capacitance between one sub-touch electrode and a second touch electrode according to change in width of the one sub-touch electrode according to an exemplary embodiment.

In FIG. 13, numerals indicated on the horizontal axis of the graph represent widths of one sub-touch electrode included in a first touch electrode, and numerals indicated on the vertical axis of the graph represent side signals according to change in width of the one sub-touch electrode. In FIG. 14, numerals indicated on the horizontal axis of the graph represent widths of one sub-touch electrode included in a first touch electrode, and numerals indicated on the vertical axis of the graph represent variations dCm in capacitance between the one sub-touch electrode and a second touch electrode adjacent thereto.

First, referring to FIG. 13, as the width of one sub-touch electrode, e.g., a second sub-touch electrode (see STE2/Tx2 of FIG. 12) (hereinafter, referred to as a "second Tx electrode") increases, a side signal at one second sub-touch electrode (see STE2/Tx3 of FIG. 12) (hereinafter, referred to as a "third Tx electrode") adjacent to the second Tx electrode STE2/Tx2 when the second Tx electrode STE2/Tx2 is touched may increase.

In an exemplary embodiment, the width of a second touch electrode (see TE2 of FIG. 12) that constitutes one unit sensor (see US of FIG. 12) together with the second Tx electrode STE2/Tx2 may be 1800 μm regardless of a change in width of the second Tx electrode STE2/Tx2. When the width of the second Tx electrode STE2/Tx2 is 1800 μm that is equal to the width of the second touch electrode TE2, a side signal at a third Tx electrode STE2/Tx3 adjacent to the second Tx electrode STE2/Tx2 may be set to a reference value Ref. In this case, the third Tx electrode STE2/Tx3 may have a width equal to that of the second Tx electrode STE2/Tx2.

If the width of the second Tx electrode STE2/Tx2 is 2200 μm, the width of the second Tx electrode STE2/Tx2 may be approximately 1.6 times larger than that of the second touch electrode TE2. In this case, it can be seen that the side signal at the third Tx electrode STE2/Tx3 adjacent to the second Tx electrode STE2/Tx2 is measured as a value that is approximately three times larger than the reference value Ref.

In addition, when the width of the second Tx electrode STE2/Tx2 is 2600 µm, the width of the second Tx electrode STE2/Tx2 may be approximately 2.6 times larger than that of the second touch electrode TE2. In this case, it can be seen that the side signal at the third Tx electrode STE2/Tx3 adjacent to the second Tx electrode STE2/Tx2 is measured as a value that is approximately eight times larger than the reference value Ref.

Consequently, it can be seen that, as the width of the second Tx electrode STE2/Tx2 becomes larger than that of the second touch electrode TE2, the side signal at the third Tx electrode STE2/Tx3 adjacent to the second Tx electrode STE2/Tx2 increases.

Subsequently, referring to FIG. 14, as the width of the second Tx electrode STE2/Tx2 becomes larger than that of the second touch electrode TE2, a variation dCm in mutual capacitance formed between the second Tx electrode STE2/Tx2 and the second touch electrode TE2 may decrease. The variation dCm in mutual capacitance according to a change in width of the second Tx electrode STE2/Tx2 will be described as follows.

When the width of the second Tx electrode STE2/Tx2 is 1800 µm that is equal to the width of the second touch electrode TE2, a variation dCm in mutual capacitance formed between the second Tx electrode STE2/Tx2 and the second touch electrode TE2 may be set to a reference value Ref.

When the width of second Tx electrode STE2/Tx2 is 2200 µm, the width of the second Tx electrode STE2/Tx2 may be approximately 1.6 times larger than that of the second touch electrode TE2. In this case, it can be seen that the variation dCm in mutual capacitance formed between the second Tx electrode STE2/Tx2 and the second touch electrode TE2 is measured equal to the reference value Ref.

In addition, when the width of second Tx electrode STE2/Tx2 is 2600 µm, the width of the second Tx electrode STE2/Tx2 may be approximately 2.6 times larger than that of the second touch electrode TE2. In this case, it can be seen that the variation dCm in mutual capacitance formed between the second Tx electrode STE2/Tx2 and the second touch electrode TE2 is measured smaller than the reference value Ref.

In an exemplary embodiment, as the width of second Tx electrode STE2/Tx2 becomes larger than that of the second touch electrode TE2, the variation dCm in mutual capacitance formed between the second Tx electrode STE2/Tx2 and the second touch electrode TE2 may decrease. The decrease in the variation dCm corresponds to about 10% or less of the reference value Ref, which has no significant influence on the touch recognition rate of the touch sensor layer (see 210 of FIG. 6).

Figure 15:
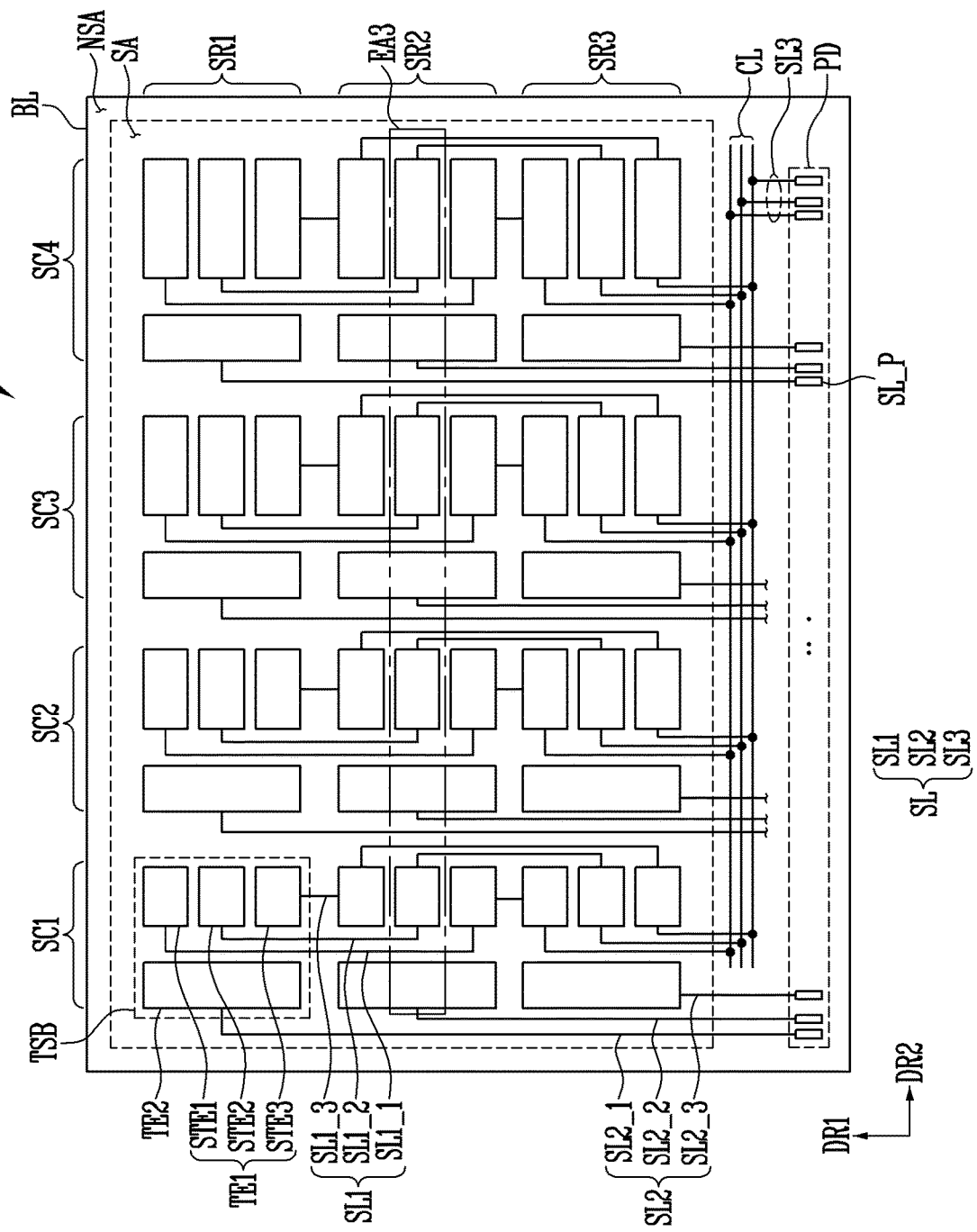
FIG. 15 is a plan view illustrating a touch sensor layer according to an exemplary embodiment.
Figure 16:
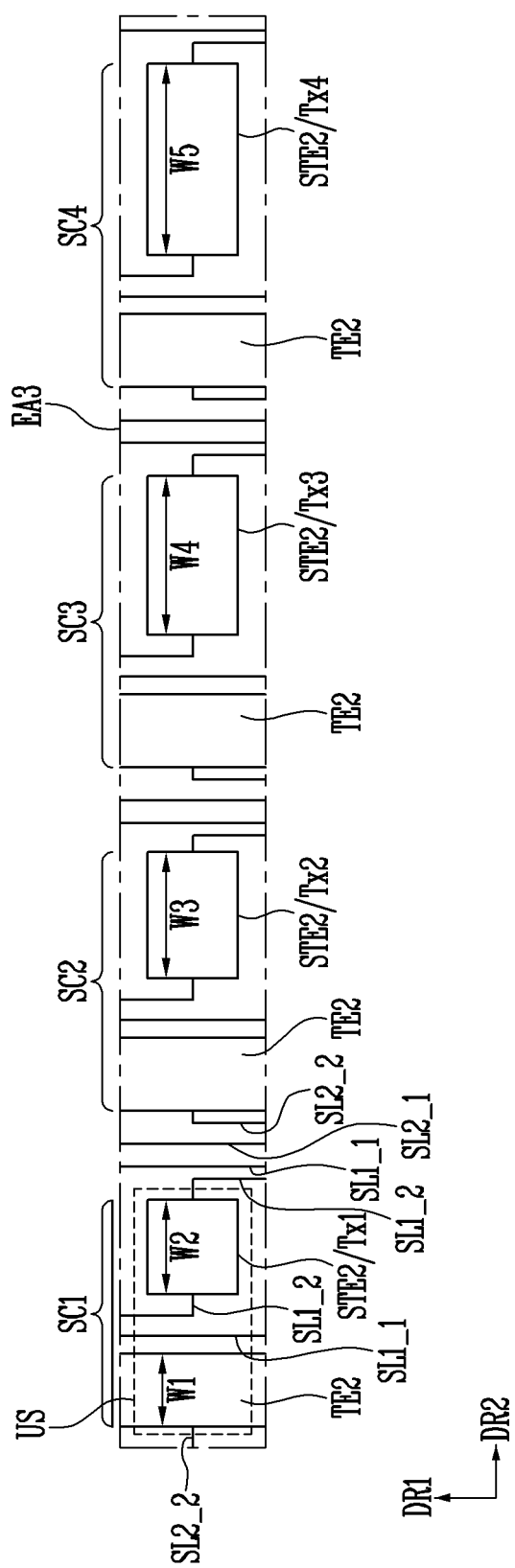
FIG. 16 is an enlarged view of region EA3 of FIG. 15 according to an exemplary embodiment.

FIG. 15 is a plan view illustrating a touch sensor layer according to an exemplary embodiment. FIG. 16 is an enlarged view of region EA3_1 of FIG. 15 according to an exemplary embodiment. Differences from the above-described touch sensor layer will be mainly described to avoid redundancy. Portions not particularly described in association with FIGS. 15 and 16 follow those of the previously described touch sensor layer. In addition, identical reference numerals refer to identical components, and similar reference numerals refer to similar components.

Referring to FIGS. 15 and 16, the touch sensor layer 210 may include a base layer BL including a sensing region SA and a non-sensing region NSA, first to fourth sensor columns SC1 to SC4 provided in the sensing region SA, and sensing lines SL connected to the first to fourth sensor columns SC1 to SC4. In an exemplary embodiment, the sensing lines SL may include first sensing lines SL1, second sensing lines SL2, and third sensing lines SL3.

Each of the first to fourth sensor columns SC1 to SC4 may include a first touch sensor column (see TSC1 of FIG. 9) having first touch electrodes TE1 and a second touch sensor column (see TSC2 of FIG. 9) having second touch electrodes TE2 adjacent to the first touch electrode TE1. The first touch sensor column TSC1 and the second touch sensor column TSC2 may be alternately disposed in the sensing region SA. Accordingly, the first touch electrodes TE1 and the second touch electrode TE2 may be alternately disposed in the sensing region SA.

The first touch electrode TE1 may include first to third sub-touch electrodes STE1, STE2, and STE3. Each of the first to third sub-touch electrodes STE1, STE2, and STE3 may be connected to a corresponding first sensing line SL1. The second touch electrode TE2 may be connected to a corresponding second sensing line SL2.

In an exemplary embodiment, the size of each of the first to third sub-touch electrodes STE1, STE2, and STE3 and the size of the second touch electrode TE2 may be designed to be different from each other. The first to third sub-touch electrodes STE1, STE2, and STE3 disposed on each of the first to fourth sensor columns SC1 to SC4 may be designed to have different sizes.

As shown in FIG. 16, the second touch electrode TE2 may have a first width W1 in a second direction DR2. A second sub-touch electrode STE2/Tx1 (hereinafter, referred to as a "first Tx electrode") disposed on the first sensor column SC1 may have a second width W2 in the second direction DR2, a second sub-touch electrode STE2/Tx2 (hereinafter, referred to as a "second Tx electrode") disposed on the second sensor column SC2 may have a third width W3 in the second direction DR2, a second sub-touch electrode STE2/Tx3 (hereinafter, referred to as a "third Tx electrode") disposed on the third sensor column SC3 may have a fourth width W4 in the second direction DR2, a second sub-touch electrode STE2/Tx4 (hereinafter, referred to as a "fourth Tx electrode") disposed on the fourth sensor column SC4 may have a fifth width W5 in the second direction DR2. The first to fifth widths W1 to W5 may be different from one another. For example, the fifth width W5 may be largest, and the first width W1 may be smallest. Therefore, when viewed on a plane, the fourth Tx electrode STE2/Tx4 disposed most adjacent to the right side of the sensing region SA may have the largest width, and the second touch electrode TE2 disposed most adjacent to the left side of the sensing region SA may have the smallest width. In other words, the widths may gradually increase from the left side of the touch sensor layer 210 to the right side of the touch sensor layer 210.

The first width W1 may be half of the second width W2 or may be half or less of the fifth width W5. For example, the ratio of the first width W1 to the second width W2 may be approximately 1:1.6, the ratio of the first width W1 to the third width W3 may be approximately 1:1.8, the width of the first width W1 to the fourth width W4 may be approximately 1:2, and the ratio of the first width W1 to the fifth width W5 may be approximately 1:2.6. In an exemplary embodiment, the ratio of the first width W1 to each of the second to fifth widths W2 to W5 may be approximately 1:1.6 to 1:2.6.

In FIGS. 15 and 16, it is illustrated that, among the sub-touch electrodes provided in the touch sensor layer 210, sub-touch electrodes disposed on the fourth sensor column SC4 have the largest width and sub-touch electrodes disposed on the first touch sensor column SC1 have the smallest width, but the disclosure is not limited thereto. For example, the sub-touch electrodes provided in the touch sensor layer 210 may be designed such that sub-touch electrodes disposed on the first sensor column SC1 have the largest width and sub-touch electrodes disposed on the fourth touch sensor column SC4 have the smallest width. In addition, the sub-touch electrodes provided in the touch sensor layer 210 may be designed such that sub-touch electrodes disposed on each of the second and third sensor columns SC2 and SC3 have the largest width.

In an exemplary embodiment, the sub-touch electrodes disposed on each of the first to fourth sensor columns SC1 to SC4 may have various shapes within a range where one sub-touch electrode has a width larger than that of one second touch electrode TE2 that constitute a unit sensor US together with the one sub-touch electrode.

When the second Tx electrode STE2/Tx2 is touched by a conductive rod (see FIG. 12), a side signal may be formed between the conductive rod 300 and each of Tx electrodes adjacent to the second Tx electrode STE2/Tx2, e.g., the first Tx electrode STE2/Tx1 and the third Tx electrode STE2/Tx3. The side signal may include a mutual capacitance between the conductive rod 300 and the first Tx electrode STE2/Tx1 and a mutual capacitance between the conductive rod 300 and the third Tx electrode STE2/Tx3 when the second Tx electrode STE2/Tx2 is touched by the conductive rod 300. The side signal may increase when the distance between one Tx electrode touched by the conductive rod 300 and Tx electrodes adjacent thereto decreases.

According to various exemplary embodiments, each of the first to fourth Tx electrodes STE2/Tx1 to STE2/Tx4 may be designed to have a width larger than that of a second touch electrode TE2 adjacent thereto. Thus, the side signal formed between a Tx electrode adjacent to one Tx electrode and the conductive rod 300 when the one Tx electrode is touched by the conductive rod 300 can increase. When the side signal increases, a touch input of the conductive rod 300, which is continuously performed, is recognized without stop so that the accuracy of a touch recognition rate can be improved. Accordingly, the touch recognition rate of the touch sensor layer 210 can be improved.

Figure 17:
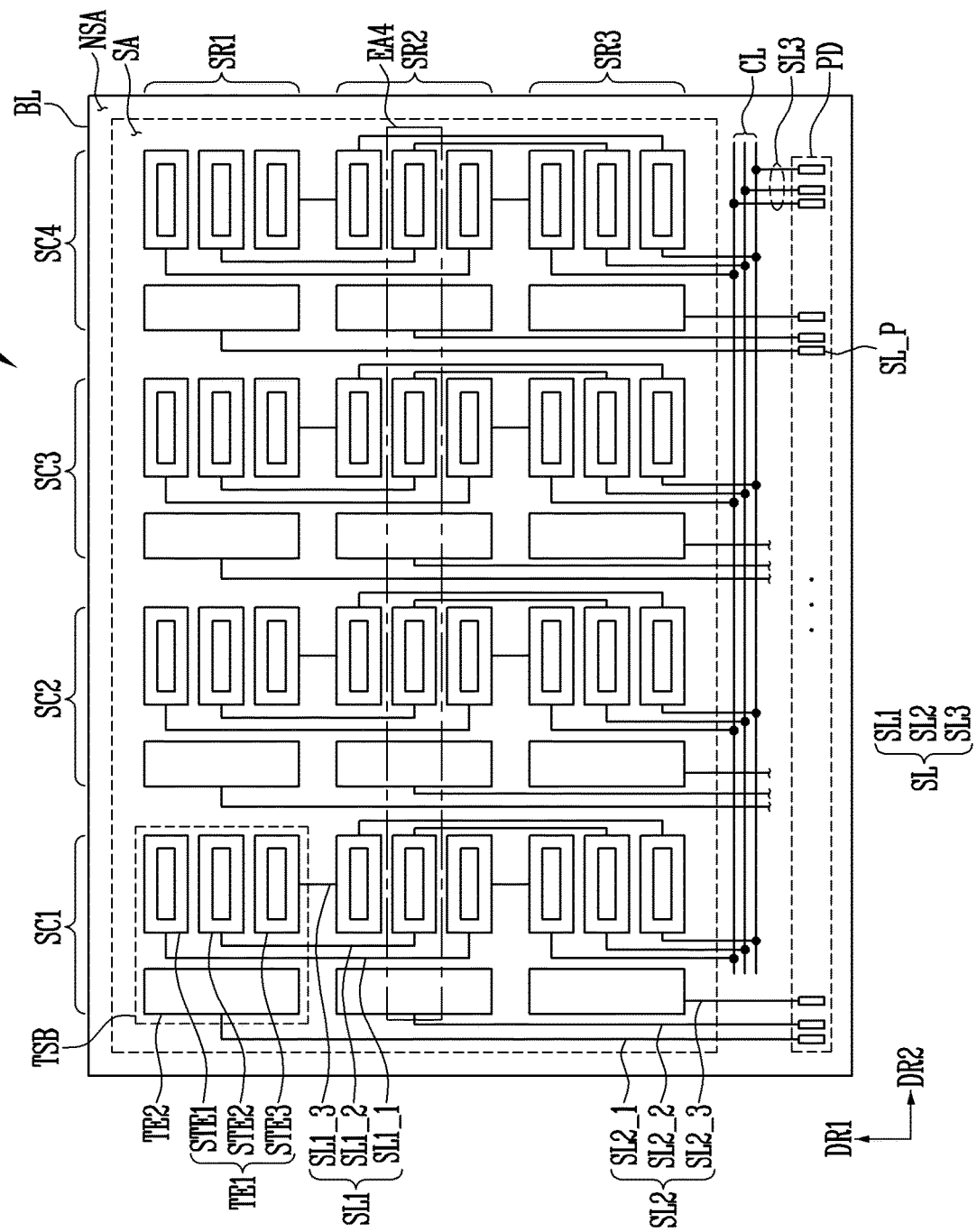
FIG. 17 is a plan view illustrating a touch sensor layer according to an exemplary embodiment.
Figure 18:
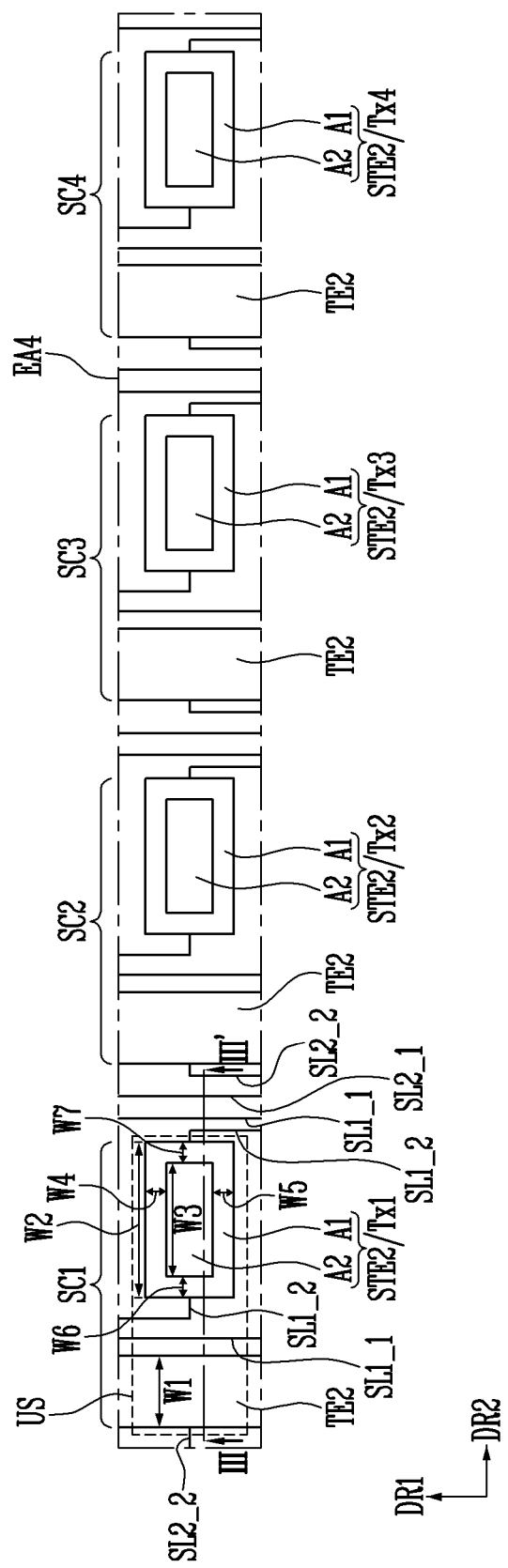
FIG. 18 is an enlarged view of region EA4 of FIG. 17 according to an exemplary embodiment.
Figure 19:
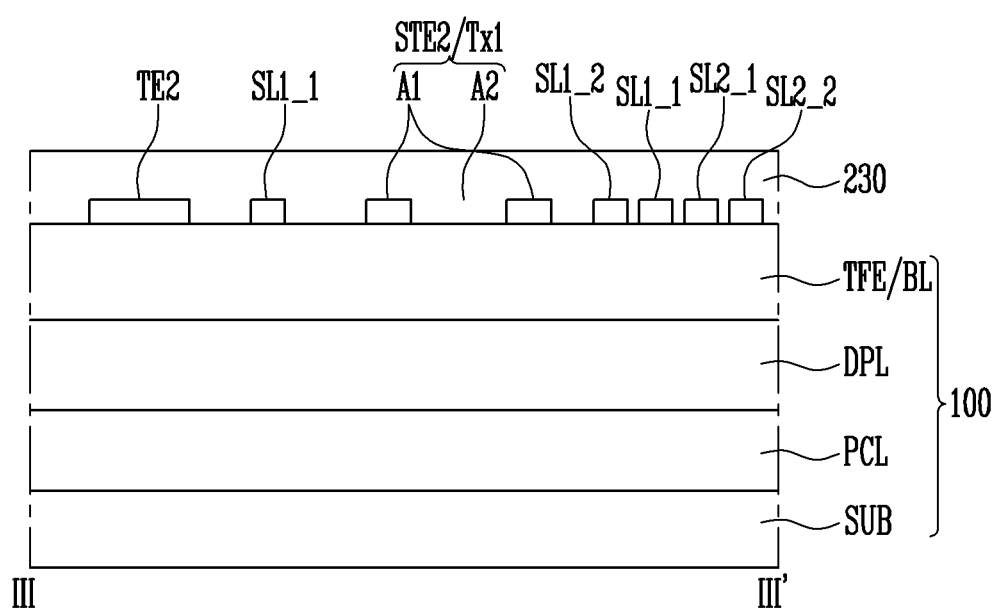
FIG. 19 is a sectional view taken along sectional line III-III' of FIG. 18 according to an exemplary embodiment.

FIG. 17 is a plan view illustrating a touch sensor layer according to an exemplary embodiment. FIG. 18 is an enlarged view of region EA4 of FIG. 17 according to an exemplary embodiment. FIG. 19 is a sectional view taken along line III-III' of FIG. 18 according to an exemplary embodiment. Differences from the above-described touch sensor layers will be mainly described to avoid redundancy. Portions not particularly described in association with FIGS. 17 to 19 follow those of the above-described touch sensor layers. In addition, identical reference numerals refer to identical components, and similar reference numerals refer to similar components.

Referring to FIGS. 17 to 19, the touch sensor layer 210 may include a base layer BL including a sensing region SA and a non-sensing region NSA, first to fourth sensor columns SC1 to SC4 provided in the sensing region SA, and sensing lines SL connected to the first to fourth sensor columns SC1 to SC4.

Each of the first to fourth sensor columns SC1 to SC4 may include a first touch sensor column (see TSC1 of FIG. 9) having first touch electrodes TE1 and a second touch sensor column (see TSC2 of FIG. 9) having second touch electrodes TE2 adjacent to the first touch electrodes TE1.

The first touch electrode TE1 may include first to third sub-touch electrodes STE1, STE2, and STE3. Each of the first to third sub-touch electrodes STE1, STE2, and STE3 may be connected to a corresponding first sensing line SL1. The second touch electrode TE2 may be connected to a corresponding second sensing line SL2.

In an exemplary embodiment, the size of each of the first to third sub-touch electrodes STE1, STE2, and STE3 and the size of the second touch electrode TE2 may be designed to be different from each other. For example, the size of the second touch electrode TE2 may be smaller than that of each of the first to third sub-touch electrodes STE1, STE2, and STE3. Here, the first to third sub-touch electrodes STE1, STE2, and STE3 may have the same size.

The second touch electrode TE2 may have a first width W1 in a second direction DR2. A second sub-touch electrode STE2 disposed adjacent to the second touch electrode TE2 may have a second width W2 in the second direction DR2. The first width W1 and the second width W2 may be different from each other. For example, the first width W1 may be smaller than the second width W2. The first width W1 may be approximately half of the second width W2, but the disclosure is not limited thereto. For example, the ratio of the first width W1 to the second width W2 may be approximately 1:1.6 to 1:2.6. In an exemplary embodiment, it is illustrated that only the second sub-touch electrode STE2 has the second width W2, but the disclosure is not limited thereto. Like the second sub-touch electrode STE2, the first and third sub-touch electrodes STE1 and STE3 may also be designed to have the second width W2.

In FIG. 18, a second sub-touch electrode STE2/Tx1 (hereinafter, referred to as a "first Tx electrode") disposed on the first sensor column SC1, a second sub-touch electrode STE2/Tx2 (hereinafter, referred to as a "second Tx electrode") disposed on the second sensor column SC2, a second sub-touch electrode STE2/Tx3 (hereinafter, referred to as a "third Tx electrode") disposed on the third sensor column SC3, and a second sub-touch electrode STE2/Tx4 (hereinafter, referred to as a "fourth Tx electrode") disposed on the fourth sensor column SC4 may have the same width. That is, the first to fourth Tx electrodes STE2/Tx1 to STE2/Tx4 may have the second width W2 in the second direction DR2.

Each of the first to fourth Tx electrodes STE2/Tx1 to STE2/Tx4 may include a first region A1 and a second region A2, which are electrically separated from each other. For instance, the second region A2 may be an opening in the first region A1. One of the first region A1 and the second region A2 may be provided inside the other of the first region A1 and the second region A2. For example, the second region A2 may be disposed inside the first region A1, and may be electrically separated from the first region A1. When viewed on a plane, the first region A1 may have a shape surrounding the second region A2. That is, the second region A2 may have an isolated island shape surrounded by the first region A1.

The first region A1 may have the second width W2 in the second direction DR2, and the second region A2 may have a third width W3 in the second direction DR2. The second width W2 and the third width W3 may be different from each other. For example, the second width W2 may be larger than the third width W3. In addition, the third width W3 may be larger than the first width W1, but the disclosure is not limited thereto. For example, the third width W3 may be equal to or smaller than the first width W1.

Each of the first region A1 and the second region A2 may be configured with four sides. A distance W4 between an upper side of the first region A1 and an upper side of the second region A2, a distance W5 between a lower side of the first region A1 and a lower side of the second region A2, a distance W6 between a left side of the first region A1 and a left side of the second region A2, and a distance W7 between a right side of the first region A1 and a right side of the second region A2 may be equal to one another, but the disclosure is not limited thereto.

As shown in FIG. 19, the first to fourth Tx electrodes STE2/Tx1 to STE2/Tx4 each including the first region A1 and the second region A2 may be provided on the base layer BL. In an exemplary embodiment, the base layer BL may be an inorganic layer disposed as the uppermost layer of the thin film encapsulation layer TFE of the display panel 100.

When the second Tx electrode STE2/Tx2 is touched by a conductive rod (see FIG. 12), a side signal may be formed between the conductive rod 300 and each of Tx electrodes adjacent to the second Tx electrode STE2/Tx2, e.g., the first Tx electrode STE2/Tx1 and the third Tx electrode STE2/Tx3. The side signal may increase when the distance between one Tx electrode touched by the conductive rod 300 and Tx electrodes adjacent thereto decreases.

According to various exemplary embodiments, each of the first to fourth Tx electrodes STE2/Tx1 to STE2/Tx4 may be designed to have a width larger than that of a second touch electrode TE2 that constitute one unit sensor US. Thus, the side signal formed between a Tx electrode adjacent to one Tx electrode and the conductive rod 300 when the one Tx electrode is touched by the conductive rod 300 can increase. When the side signal increases, a touch input of the conductive rod 300, which is continuously performed, is recognized without stop so that the accuracy of a touch recognition rate can be improved. Accordingly, the touch recognition rate of the touch sensor layer 210 can be improved.

The display device DD according to various exemplary embodiments can be employed in various electronic devices. For example, the display device can be applicable to televisions, notebook computers, cellular phones, smart phones, smart pads, personal media players (PMPs), personal digital assistants (PDAs), navigation devices, various wearable devices, such as smart watches, and the like.

According to various exemplary embodiments, it is possible to provide a touch sensor capable of improving a touch recognition rate and a display device including the touch sensor.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A touch sensor comprising:
a base layer comprising a sensing region and a non-sensing region;
first touch sensor columns extending in a first direction, the first touch sensor columns comprising first touch electrodes, the first touch electrodes comprising sub-touch electrodes in the sensing region;
second touch sensor columns comprising second touch electrodes in the sensing region, the second touch sensor columns being alternately arranged with the first touch sensor columns; and
sensing lines in the non-sensing region, the sensing lines comprising:
first sensing lines electrically connected to the sub-touch electrodes; and
second sensing lines electrically connected to the second touch electrodes, wherein:
the sub-touch electrodes and the second touch electrodes have different widths;
each first touch electrode comprises a group of i (i being a natural number of 2 or more) sub-touch electrodes sequentially arranged in the first direction; and
each sub-touch electrode of a group is electrically connected to a sub-touch electrode of another group through a first sensing line among the first sensing lines, the group being adjacent to the another group along the first direction.

2. The touch sensor of claim 1, wherein:
the sub-touch electrodes have first widths along a second direction;
the second direction intersects the first direction;
the second touch electrodes have second widths along the second direction; and
each first width among the first widths is greater than each second width among the second widths.

3. The touch sensor of claim 2, wherein each first width among the first widths is equivalent.

4. The touch sensor of claim 2, wherein some of the first widths are different.

5. The touch sensor of claim 4, wherein each of the sub-touch electrodes has a width different from that of a sub-touch electrode disposed adjacent thereto along the second direction.

6. The touch sensor of claim 1, further comprising:
a pad unit disposed in the non-sensing region, the pad unit being electrically connected to each of the first sensing lines and the second sensing lines; and
contact lines disposed in the non-sensing region, the contact lines electrically connecting the first sensing lines with the pad unit.

7. The touch sensor of claim 6, wherein:
each of the second touch sensor columns comprises q (q being a natural number of 2 or more) second touch electrodes; and
each second touch electrode is electrically connected to the pad unit through a second sensing line among the second sensing lines.

8. A touch sensor comprising:
a base layer comprising a sensing region and a non-sensing region;
first touch sensor columns extending in a first direction, the first touch sensor columns comprising first touch electrodes, the first touch electrodes comprising sub-touch electrodes in the sensing region;
second touch sensor columns comprising second touch electrodes in the sensing region, the second touch sensor columns being alternately arranged with the first touch sensor columns; and
sensing lines in the non-sensing region, the sensing lines comprising:
first sensing lines electrically connected to the sub-touch electrodes; and
second sensing lines electrically connected to the second touch electrodes, wherein:
the sub-touch electrodes and the second touch electrodes have different widths;

the sub-touch electrodes have first widths along a second direction;

the second direction intersects the first direction;

the second touch electrodes have second widths along the second direction;

each first width among the first widths is greater than each second width among the second widths;

each of the sub-touch electrodes comprises a first region and a second region electrically separated from the first region; and one of the first region and the second region is disposed inside the other of the first region and the second region.

9. The touch sensor of claim 8, wherein, along the second direction, a width of the first region is greater than each second width among the second widths.

10. The touch sensor of claim 1, wherein the first touch electrodes and the second touch electrodes are disposed in the same layer.

11. A display device comprising:
a display panel; and
a touch sensor disposed on at least one surface of the display panel,
wherein the touch sensor comprises:
  a base layer comprising a sensing region and a non-sensing region;
  first touch sensor columns extending in a first direction, the first touch sensor columns comprising first touch electrodes, the first touch electrodes comprising sub-touch electrodes in the sensing region;
  second touch sensor columns comprising second touch electrodes in the sensing region, the second touch sensor columns being alternately arranged with the first touch sensor columns; and
  sensing lines in the non-sensing region, the sensing lines comprising:
    first sensing lines electrically connected to the sub-touch electrodes; and
    second sensing lines electrically connected to the second touch electrodes,
wherein:
  the sub-touch electrodes and the second touch electrodes have different widths;
  each first touch electrode comprises a group of i (i being a natural number of 2 or more) sub-touch electrodes sequentially arranged in the first direction;
  each sub-touch electrode of a group is electrically connected to a sub-touch electrode of another group through a first sensing line among the first sensing lines, the group being adjacent to the another group along the first direction.

12. The display device of claim 11, wherein:
the sub-touch electrodes have first widths along a second direction;
the second direction intersects the first direction;
the second touch electrodes have second widths along the second direction; and
each first width among the first widths is greater than each second width among the second widths.

13. The display device of claim 12, wherein each first width among the first widths is equivalent.

14. The display device of claim 12, wherein some of the first widths are different.

15. The display device of claim 14, wherein each of the sub-touch electrodes has a width different from that of a sub-touch electrode disposed adjacent thereto along the second direction.

16. The display device of claim 12, wherein:
each of the sub-touch electrodes comprises a first region and a second region electrically separated from the first region; and
one of the first region and the second region is disposed inside the other of the first region and the second region.

17. The display device of claim 16, wherein, along the second direction, a width of the first region is greater than each second width among the second widths.

18. The display device of claim 11, wherein the first touch electrodes and the second touch electrodes are disposed in the same layer on an upper surface of the display panel.

19. The display device of claim 11, wherein each of the second touch sensor columns comprises q (q being a natural number of 2 or more) second touch electrodes, each second touch electrode among the second touch electrodes being electrically connected to a pad unit through a second sensing line among the second sensing lines.

* * * * *